(12) United States Patent
Aizawa

(10) Patent No.: US 10,267,921 B2
(45) Date of Patent: Apr. 23, 2019

(54) ELECTRONIC DEVICE

(71) Applicant: Seiko Epson Corporation, Shinjuku-ku (JP)

(72) Inventor: Tadashi Aizawa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 286 days.

(21) Appl. No.: 15/389,953

(22) Filed: Dec. 23, 2016

(65) Prior Publication Data

US 2017/0184724 A1 Jun. 29, 2017

(30) Foreign Application Priority Data

Dec. 25, 2015 (JP) .................................. 2015-253149

(51) Int. Cl.
| | | |
|---|---|---|
| *G01S 19/14* | (2010.01) | |
| *H01L 23/64* | (2006.01) | |
| *H01L 23/66* | (2006.01) | |
| *G01S 19/36* | (2010.01) | |

(52) U.S. Cl.
CPC .............. *G01S 19/14* (2013.01); *G01S 19/36* (2013.01); *H01L 23/642* (2013.01); *H01L 23/66* (2013.01); *H01L 2223/6605* (2013.01); *H01L 2223/6677* (2013.01)

(58) Field of Classification Search
CPC ... A61N 1/37247; H01Q 7/00; G02F 1/13338
USPC ....... 343/720, 718, 702, 700; 349/12; 600/8; 607/45, 116, 119
See application file for complete search history.

(56) References Cited

U.S. PATENT DOCUMENTS

| | | | |
|---|---|---|---|
| 6,633,261 B2 * | 10/2003 | Iwai ....................... | H01Q 1/243 343/700 MS |
| 6,958,732 B2 | 10/2005 | Yuanzhu | |
| 6,982,673 B2 | 1/2006 | Yuanzhu | |
| 8,711,039 B2 | 4/2014 | Horisawa et al. | |
| 2004/0065158 A1 * | 4/2004 | Schrepfer ................ | A61B 5/05 73/864.81 |
| 2008/0198086 A1 | 8/2008 | Coupez et al. | |
| 2011/0156963 A1 * | 6/2011 | Rajgopal ................. | H01P 1/203 343/702 |
| 2011/0227800 A1 * | 9/2011 | Takahashi ............ | C09K 11/574 343/720 |

(Continued)

FOREIGN PATENT DOCUMENTS

| | | |
|---|---|---|
| JP | 07-297626 A | 11/1995 |
| JP | 07-297627 A | 11/1995 |

(Continued)

*Primary Examiner* — Kiet M Doan
(74) *Attorney, Agent, or Firm* — Kilpatrick Townsend & Stockton LLP

(57) ABSTRACT

An electronic device includes an antenna including an antenna electrode, a circuit substrate, and a short-circuit portion short-circuiting the antenna electrode and the circuit substrate, a display unit, a case accommodating the antenna and the display unit, and a band connected to the case. In the short-circuit portion, a width in a direction intersecting a line segment binding a position of the short-circuit portion connected to the antenna electrode and a position of the short-circuit portion connected to the circuit substrate is narrower than a maximum width of the antenna electrode and a maximum width of the circuit substrate in a direction oriented along the intersection direction.

14 Claims, 30 Drawing Sheets

(56) References Cited

U.S. PATENT DOCUMENTS

2012/0213039 A1    8/2012  Aizawa et al.
2017/0141472 A1*   5/2017  Park .................... H01Q 9/0414

FOREIGN PATENT DOCUMENTS

| JP | 2004-312166 A | 11/2004 |
| --- | --- | --- |
| JP | 2004-343285 A | 12/2004 |
| JP | 2005-005866 A | 1/2005 |
| JP | 2007-535851 A | 12/2007 |
| JP | 4818734 B2 | 9/2011 |
| JP | 2012-147263 A | 8/2012 |
| JP | 2012-189570 A | 10/2012 |
| JP | 2012-248982 A | 12/2012 |
| JP | 2013-061308 A | 4/2013 |

\* cited by examiner

ELECTRONIC DEVICE

CROSS-REFERENCE TO RELATED APPLICATIONS

The entire disclosure of Japanese Patent Application No. 2015-253149, filed Dec. 25, 2015 is expressly incorporated by reference herein.

BACKGROUND

1. Technical Field

The present invention relates to an electronic device.

2. Related Art

When global positioning system (GPS) receivers are incorporated in small-sized casings of wrist watches, it is necessary to reduce volumes of antennas used in the receivers as much as possible. In the related art, antennas said to be planar inverted F antennas have been proposed. As an example of a planar inverted F antenna appropriate for miniaturization, an antenna disclosed in JP-A-2005-5866 includes a circuit substrate on which electronic components of a high-frequency circuit are mounted and a cover that is disposed to cover the upper side of the high-frequency circuit. In such a planar inverted F antenna, a feeding conductor of the cover is connected to a wiring pattern and a ground conductor of the cover is connected to a ground pattern.

In JP-A-2005-5866, however, there is a problem that sensitivity of an antenna deteriorates due to an influence of a method of mounting the planar inverted F antenna on a watch or a component on the circuit substrate.

SUMMARY

An advantage of some aspects of the invention is that it provides an electronic device in which it is easy to suppress deterioration in sensitivity of an antenna.

The invention can be implemented as the following forms or application examples.

Application Example 1

An electronic device according to this application example includes: an antenna that includes a first electrode plate, a second electrode plate, and a short-circuit portion short-circuiting the first and second electrode plates; a display unit; a case in which the antenna and the display unit are accommodated; and a band that is connected to the case. A width of the short-circuit portion along a direction intersecting a line segment binding a position of the short-circuit portion connected to the first electrode plate and a position of the short-circuit portion connected to the second electrode plate is set as follows. The width of the short-circuit portion is narrower than a maximum width of the first electrode plate and a maximum width of the second electrode plate in a direction oriented along the intersection direction. The short-circuit portion is disposed as follows in a plan view of the case in a direction vertical to the display unit and from the side of the display unit. In a case in which a letter is displayed on the display unit on the assumption that a direction oriented along a line parallel in a longitudinal direction of the band is a vertical direction, an upper side of the letter is defined as 0 degrees, a clockwise rotation direction is defined as being positive, and one circle is defined as 360 degrees. In this case, a part or all of the short-circuit portion is disposed in a range equal to or greater than 180 degrees and equal to or less than 360 degrees of the case.

According to this application example, the width of the antenna in the direction intersecting the line segment binding the position of the short-circuit portion connected to the first electrode plate and the position of the short-circuit portion connected to the second electrode plate is narrower than the maximum width of the first electrode plate and the maximum width of the second electrode plate in a direction oriented along the intersection direction. Accordingly, a current does not flow in parallel to the direction intersecting the width direction of the first electrode plate or the second electrode plate across the entire region with the maximum width of the first electrode plate or the second electrode plate, but a current flows radially from the short-circuit portion with the width narrower than the maximum width. As a result, as the current flowing from the short-circuit portion, there is a current flowing to the direction intersecting the width direction of the first electrode plate or the second electrode plate from the width direction of the first electrode plate or the second electrode plate. Therefore, a current path is lengthened. As a result, it is possible to obtain a wavelength reduction effect without using a dielectric substance. When a user mounts the electronic device including the antenna on his or her arm or wrist, it is possible to obtain an electric field blocking effect because of the thickness of the arm or the wrist in a direction vertical to a contact surface of the electronic device on the arm or the wrist. Accordingly, the right-hand circular polarization can be obtained on the right side and the left-hand circular polarization can be obtained on the left side with respect to a central line of the antenna passing through a middle point of the short-circuit portion in the direction vertical to the short-circuit portion. Here, in a case in which the letter is displayed on the display unit on the assumption that a direction oriented along a line parallel in a longitudinal direction of the band is a vertical direction, in a plan view of the case in a direction vertical to the display unit and from the side of the display unit, an upper side of the letter is defined as 0 degrees, a clockwise rotation direction is defined as being positive, and one circle is defined as 360 degrees. In this case, by disposing a part or all of the short-circuit portion in the range equal to or greater than 180 degrees and equal to or less than 360 degrees of the case, right-hand circular polarization can be obtained in the direction of zenith when the user takes a running posture. As a result, it is possible to satisfactorily receive radio waves from the GPS satellites.

Application Example 2

An arm-mounted electronic device according to this application examples includes: an antenna that includes a first electrode plate, a second electrode plate, and a short-circuit portion short-circuiting the first and second electrode plates; a display unit; a case in which the antenna and the display unit are accommodated; and a band that is connected to the case. A width of the short-circuit portion in a direction intersecting a line segment binding a position of the short-circuit portion connected to the first electrode plate and a position of the short-circuit portion connected to the second electrode plate is set as follows. The width of the short-circuit portion is narrower than a maximum width of the first electrode plate and a maximum width of the second electrode plate in a direction oriented along the intersection direction. A part or all of the short-circuit portion is disposed as follows in a plan view of the case from the direction vertical to the display unit in a state in which the user mounts the case on his or her arm or wrist using the band. In a straight line parallel to the longitudinal direction of the band and passing through the center of the case, a little finger side of the user from a center of the case is defined as 0 degrees, a clockwise rotation direction is defined as being positive, and one circle is defined as 360 degrees. In this case, the short-circuit portion is disposed in the range equal to or greater than 180 degrees and equal to or less than 360 degrees of the case.

According to this application example, the width of the short-circuit portion in the direction intersecting the line segment binding the position of the short-circuit portion connected to the first electrode plate and the position of the short-circuit portion connected to the second electrode plate is narrower than the maximum width of the first electrode plate and the maximum width of the second electrode plate in a direction oriented along the intersection direction. Accordingly, a current does not flow in parallel to the direction intersecting the width direction of the first electrode plate or the second electrode plate across the entire region with the maximum width of the first electrode plate or the second electrode plate, but a current flows radially from the short-circuit portion with the width narrower than the maximum width. Further, since a current flows to the direction intersecting the width direction of the first electrode plate or the second electrode plate from the width direction of the first electrode plate or the second electrode plate, a current path is lengthened. As a result, it is possible to obtain a wavelength reduction effect without using a dielectric substance. When the user mounts the electronic device including the antenna on his or her arm or wrist, it is possible to obtain the electric field blocking effect because of the thickness of the arm or the wrist in the direction vertical to a contact surface of the electronic device on the arm or the wrist. Accordingly, the right-hand circular polarization can be obtained on the right side and the left-hand circular polarization can be obtained on the left side with respect to a central line of the antenna passing through a middle point of the short-circuit portion in the direction vertical to the short-circuit portion. Here, angles in a plan view of the case in the direction vertical to the display unit in a state in which the user mounts the case on his or her arm or wrist using the band are defined. In the straight line parallel to the longitudinal direction of the band and passing through the center of the case, the little finger side of the user from the center of the case is defined as 0 degrees, the clockwise rotation direction is defined as being positive, and one circle is defined as 360 degrees. In this case, by disposing a part or all of the short-circuit portion in the range equal to or greater than 180 degrees and equal to or less than 360 degrees of the case, the right-hand circular polarization can be obtained in the direction of zenith when the user takes a running posture. As a result, it is possible to satisfactorily receive radio waves from the GPS satellites.

Application Example 3

The electronic device may further include a gap holding member that holds a gap between the first and second electrode plates. The gap may be filled with air.

According to this application example, since there is the air in the space held between the first and second electrode plates by the gap holding member, the gap between the first and second electrode plates can be constantly held and receive radio waves from the gap portion. Since the shape of the antenna is stabilized more than in a case in which there is no gap holding member, radio waves are received satisfactorily.

Application Example 4

The gap holding member may include a concave portion or a convex portion fitted to the first electrode plate and a concave portion or a convex portion fitted to the second electrode plate.

According to this application example, horizontal dislocation between the first electrode plate and the gap holding member is prevented and horizontal dislocation between the second electrode plate and the gap holding member is prevented by the concave portion or the convex portion. Accordingly, since horizontal dislocation between the first and second electrode plates is prevented, it is possible to prevent the sensitivity of the antenna caused due to deviation in the resonance frequency from deteriorating without occurrence of deviation of overlapping positions of the first and second electrode plates.

Application Example 5

The electronic device may further include a second short-circuit portion short-circuiting the first and second electrode plates at a different position from the short-circuit portion.

According to this application example, the second short-circuit portion short-circuiting the first and second electrode plates is included at the different position from the short-circuit portion apart from the short-circuit portion. The inclusion of the second short-circuit portion is equivalent to a change in the original width of the short-circuit portion, and a frequency can accordingly be adjusted.

Application Example 6

The electronic device may further include a circular conductor that is disposed at an overlapping position with the antenna in a plan view of the case in a direction vertical to the display unit. At least one incision of the conductor may be disposed at a position equal to or greater than 0 degrees and equal to or less than 180 degrees on the assumption that one circle is 360 degrees.

According to this application example, for example, in the case of the antenna of right-hand circular polarization, the incision is formed on the right side of the central line of the antenna in the direction vertical to the longitudinal direction of the band in the circular conductor included at the overlapping position with the antenna. Accordingly, a portion on the left side of the conductor with respect to the central line of the antenna is longer than a portion on the right side of the conductor, a current in a direction in which a current of the antenna body flowing in the portion of the left side of the conductor negates is greater than a current in a direction in which a current of the antenna body flowing in the portion of the right side of the conductor negates. As a result, the current component generating the left-hand circular polarization is negated and the right-hand circular polarization can be emphasized.

Application Example 7

The second electrode plate may be a circuit substrate.

According to this application example, for example, the first electrode plate serves as a radiation plate and the circuit substrate is used as a conductive plate serving as the second electrode plate. As a result, it is possible to miniaturize the antenna and it is possible to reduce the number of components.

Application Example 8

The display unit may be an electronic control type display device. The electronic device may further include a wiring that is disposed between the short-circuit portion and the case and connects the display unit to the second electrode plate.

A voltage distribution in the antenna is larger in open end sides of the first and second electrode plates than on the side of short-circuit portion. When the wiring is disposed on the side on which the voltage distribution is larger, the first and second electrode plates may equivalently be short-circuited, and thus there is a concern of the function of the antenna degrading. However, in the application example, since the wiring is disposed between the short-circuit portion and the case, short-circuiting by the wiring can be substantially integrated with short-circuiting by the short-circuit portion, and thus it is possible to suppress an influence of the wiring. Accordingly, the antenna functions satisfactorily.

Application Example 9

In the plan view, a shape of the first electrode plate and a shape of the display unit may be substantially congruent. The first electrode plate may be disposed at a position closer to the display unit than the second electrode plate.

According to this application example, since the display unit operating to absorb radio waves is shielded by the first electrode plate, radio waves can be received satisfactorily.

Application Example 10

The electronic device may further include a circuit substrate that is disposed between the first and second electrode plates.

According to this application example, since the circuit substrate is shielded by the first and second electrode plates, radio waves can be received satisfactorily.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
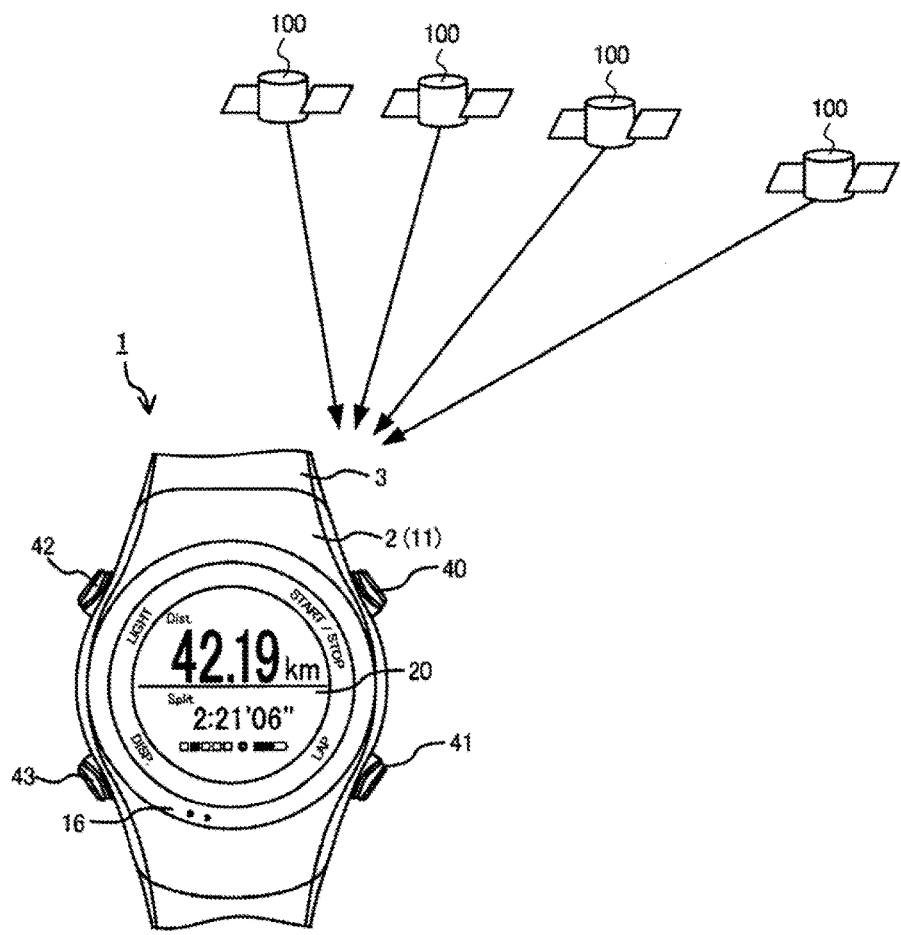
FIG. 1 is a general diagram illustrating an example of a GPS system including a built-in antenna running watch as an example of an electronic device according to a first embodiment of the invention.

Hereinafter, preferred embodiments of the invention will be described with reference to the appended drawings. In the drawings, the dimensions and scales of units are appropriate different from actual dimensions and scales. Since the following embodiments are preferred specific examples of the invention, various technically preferred limitations are imposed. However, the range of the invention is not limited to the forms unless otherwise particularly mentioned to limit the invention in the following description.

First Embodiment

A: Mechanical Configuration of Built-In Antenna Electronic Device

FIG. 1 is a general diagram schematically illustrating an example of a GPS system including an electronic device according to a first embodiment of the invention. As illustrated in FIG. 1, an electronic device 1 according to the embodiment is an arm-mounted running watch mounted on a wrist or an arm of a user. The running watch receives satellite signals (GPS signals) transmitted from several GPS satellites 100 in the sky using GPS receivers and contains a GPS function capable of calculating a current position. The electronic device 1 can measure, for example, a running distance, a speed, or a route at the time of running based on position information and time information calculated using the GPS signals and supports an exercise of the user.

Figure 2:
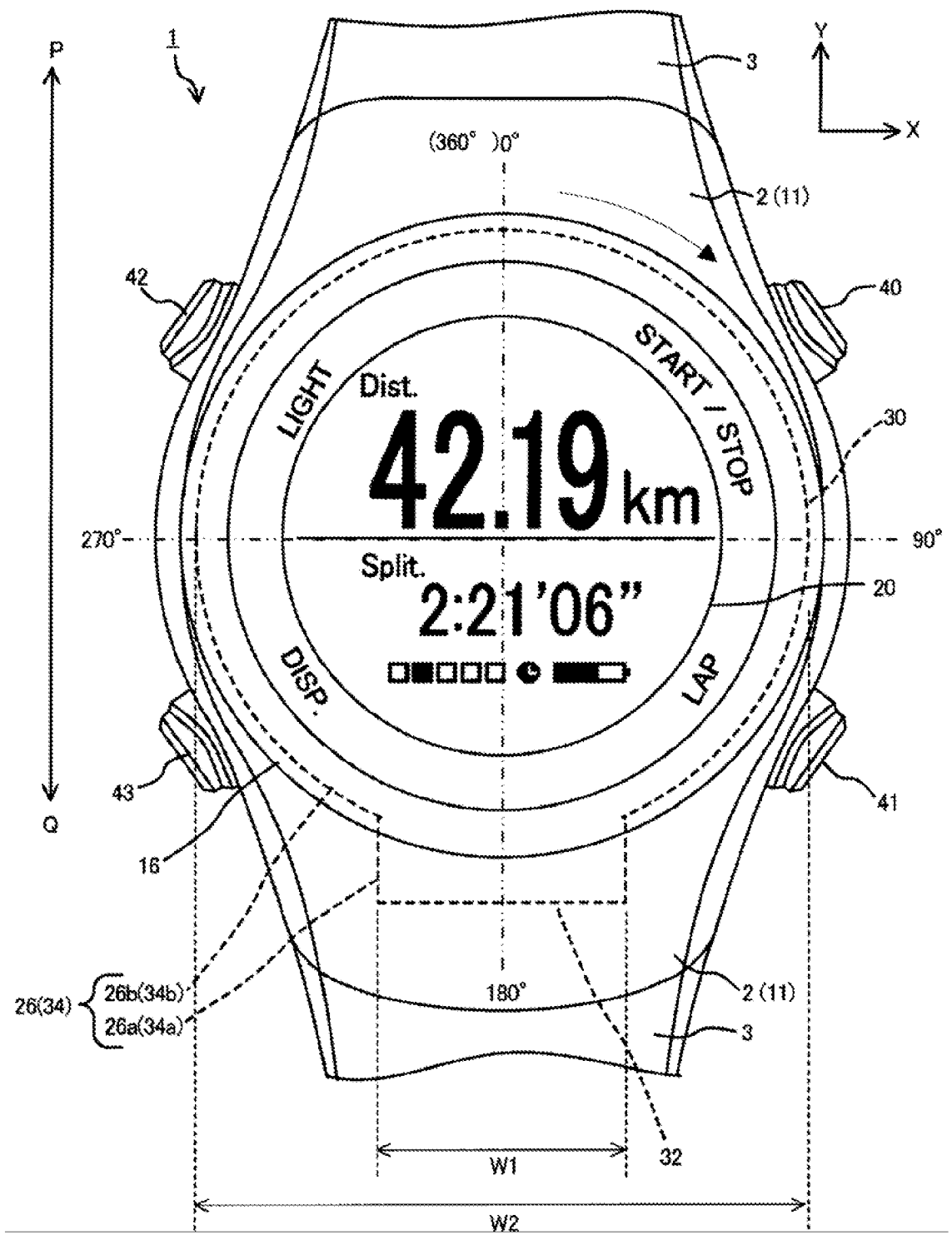
FIG. 2 is a plan view illustrating the electronic device.

FIG. 2 is a plan view illustrating the electronic device 1 illustrated in FIG. 1. As illustrated in FIG. 2, the electronic device 1 includes a case 2 and a band 3. The band 3 is formed to extend in a longitudinal direction wound around a wrist or an arm of the user. A part of the band 3 is omitted, as indicated by a wave line in FIG. 2. In the electronic device 1, a side on which the user views a time or measurement data is referred to as a front surface side and a side on which the electronic device 1 is mounted on the wrist or the arm is referred to as a rear surface side. In the embodiment, in a case in which the case 2 is viewed in a direction vertical to a display unit 20 and from the side of the display unit 20, angles are defined as follows. When a direction oriented along a line PQ parallel to the longitudinal direction of the band 3 illustrated in FIG. 2 is a vertical direction, the upward direction of letters or numbers displayed on the display unit 20 is assumed to be 0 degrees. Further, it is assumed that the clockwise rotation direction is positive and one circle is 360 degrees.

Figure 3:
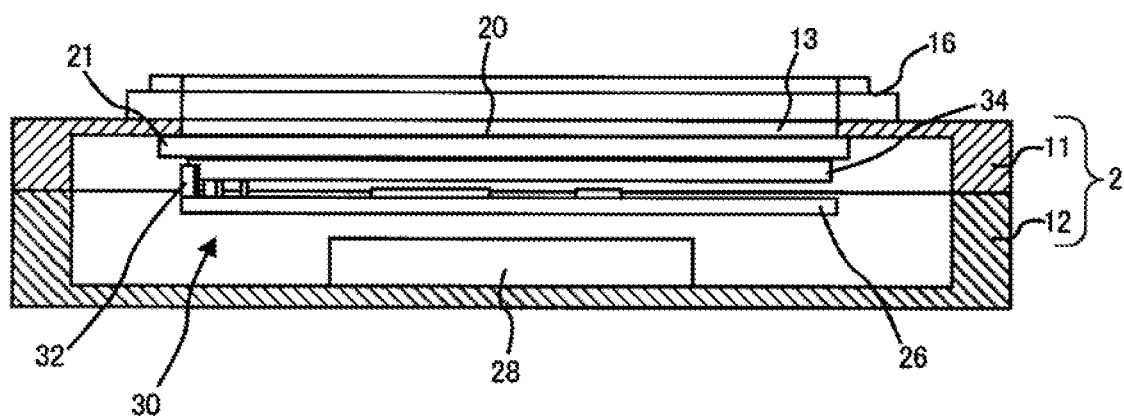
FIG. 3 is a partial sectional view illustrating the electronic device.

FIG. 3 is a sectional view illustrating the electronic device 1 illustrated in FIG. 2. As illustrated in FIG. 3, the case 2 includes a case body 11 and a back cover 12. The case body 11 is made of plastic such as a polycarbonate resin and is formed in a substantially cylindrical shape. The back cover 12 is mounted on the rear surface side of the case body 11 which is an arm side on which the electronic device 1 is mounted, and is blocked by an opening of the rear surface side. The back cover 12 may be made of the same plastic as the case body 11 or may be made of metal such as stainless steel. A one-piece type case formed by integrating the case body 11 and the back cover 12 may be used as the case.

A glass (windshield) 13 which is a light transparent member is mounted on an opening of the front of the case body 11, that is, the case 2. The glass 13 may be formed of indium tin oxide (ITO) or the ITO may be patterned.

The light transparent member is not limited to a member made of glass, but may be made of plastic. A plate-shaped member in which a rear surface side (the display unit 20) of the light transparent member can be viewed by the user from the front surface side of the light transparent member may be used.

A bezel 16 which is a circular conductor is mounted on the front surface side of the case body 11. The bezel 16 is made of metal such as stainless steel, titanium, aluminum, copper, or sliver and is formed in a circular shape. A member on which plating is performed can used as the bezel 16. Further, the bezel 16 may contain ITO. The bezel 16 has a function of performing reinforcement so that the glass 13 is fitted and fixed to the case body 11.

As illustrated in FIG. 3, the display unit 20 and an antenna 30 are disposed in order from the side of the glass 13 to the side of the back cover 12 in an internal space between the case body 11 and the back cover 12. The antenna 30 includes an antenna electrode 34 serving as a first electrode plate and a circuit substrate 26 serving as a second electrode plate. The detailed configuration of the antenna 30 will be described below.

The display unit 20 includes a liquid crystal panel 21 with a backlight which is an electronic control type display device and a panel frame (not illustrated) holding the liquid crystal panel 21. The liquid crystal panel 21 is connected to the circuit substrate 26 via a flexible substrate. The panel frame is configured of a non-conductive member made of plastic.

The circuit substrate 26 controls display of the display unit 20 and various ICs processing satellite signals received by the antenna 30 are mounted. In the embodiment, the circuit substrate 26 also functions as a ground (GND) plate.

B: Circuit Configuration of Built-In Antenna Electronic Device

Figure 4:
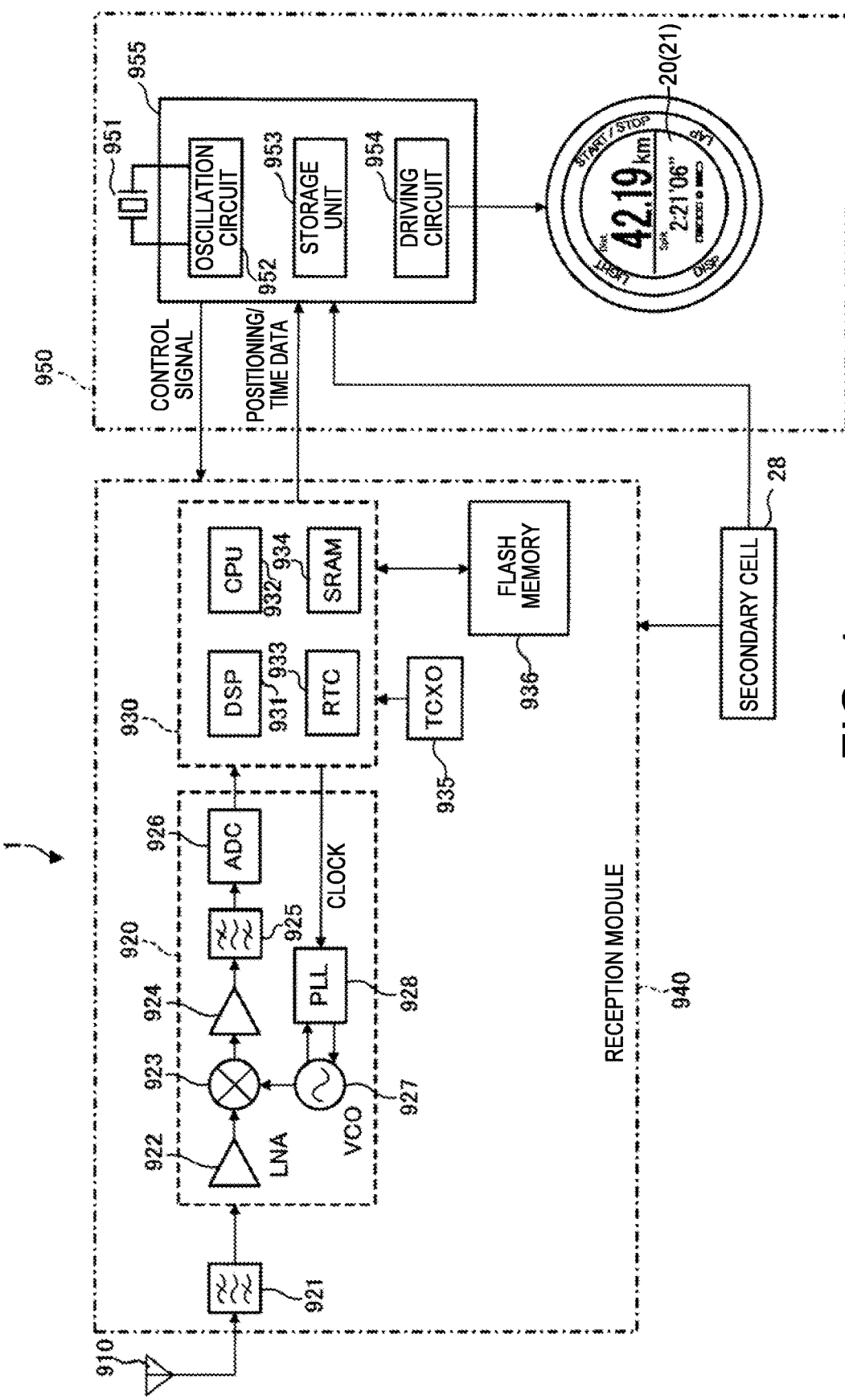
FIG. 4 is a block diagram illustrating an example of a circuit configuration of the electronic device.

Next, a circuit configuration of the electronic device 1 according to the embodiment will be described with reference to FIG. 4. The electronic device 1 according to the embodiment is configured to receive positioning signals or the like by radio waves from the GPS satellites 100 for use.

The GPS satellite 100 illustrated in FIG. 1 is a positional information satellite that turns around along a predetermined orbit in the sky of the earth and transmits, for example, satellite signals in which navigation messages or the like are superimposed on microwaves of 1.57542 GHz to the ground. An atomic clock is mounted on the GPS satellite 100, and a satellite signal includes GPS time information which is considerably accurate time information measured by the atomic clock. Accordingly, the electronic device 1 having a function of the GPS receiver can receive at least one satellite signal and display an accurate time by correcting advance or delay of an internal time. The correction is performed as a clocking mode.

The satellite signal also includes orbit information indicating a position of the GPS satellite 100 on the orbit. That is, the electronic device 1 can also perform positioning calculation and has a function of normally receiving satellite signals transmitted from four or more GPS satellites 100 and performing positioning calculation using the orbit information and GPS time information included in the satellite signals. The electronic device 1 can easily correct a time difference in tune with a current position through the positioning calculation, and the correction is performed as a positioning mode. A radio wave emitted by the GPS satellite 100 is a right-hand circular polarization and minimizes a variation in reception sensitivity caused due to the posture of a reception antenna or an error of clocking or positioning caused due to an influence of a multipath occurring in a valley between buildings.

When the satellite signal is used in addition to the foregoing description, various applications such as current position display, movement distance measurement, and movement speed measurement can be made. In the electronic device 1, such information can be displayed in a digital manner by the liquid crystal panel 21 of the display unit 20. As illustrated in FIGS. 1 and 2, the electronic device 1 includes push buttons 40, 41, 42, and 43. By manipulating the push buttons 40, 41, 42, and 43, it is possible to perform switch between pieces of information display on the liquid crystal panel 21 and various other kinds of control.

Next, a circuit configuration of the electronic device 1 which is a running watch having a GPS reception function will be described. FIG. 4 is a block diagram illustrating the electronic device 1 according to the embodiment. As illustrated in FIG. 4, the electronic device 1 includes an antenna unit 910, a reception module 940, a display unit 950 including a control unit 955, and a secondary battery 28.

The reception module 940 is connected to the antenna unit 910 and is configured to include a surface acoustic wave (SAW) filter 921, a radio frequency (RF) unit 920, and a baseband system unit 930. The SAW filter 921 performs a process of extracting a satellite signal from radio waves received by the antenna unit 910. The RF unit 920 includes a low noise amplifier (LNA) 922, a mixer 923, and a voltage controlled oscillator (VCO) 927. The RF unit 920 is configured to further include a phase locked loop (PLL) control circuit 928, an intermediate frequency (IF) amplifier 924, an IF filter 925, and an A/D converter (ADC) 926.

The satellite signal extracted by the SAW filter 921 is amplified by the LNA 922, is mixed with a local signal output by the VCO 927 by the mixer 923, and is down-converted to a signal with an intermediate frequency band. The PLL control circuit 928 and the VCO 927 form a phase locked loop. Then, by comparing the phase of a signal distributed from the local signal output from the VCO 927 to that of a stable reference clock signal and synchronizing the local signal to the reference clock signal by feedback, it is possible to achieve generation and stabilization of the local signal with an accurate frequency. The signal mixed by the mixer 923 is amplified by the IF amplifier 924 and an unnecessary signal is removed by the IF filter 925. A signal passing through the IF filter 925 is converted into a digital signal by the A/D converter (ADC) 926.

The baseband system unit 930 is configured to include a digital signal processor (DSP) 931, a central processing unit (CPU) 932, a static random access memory (SRAM) 934, a real time clock (RTC) 933. A temperature compensated crystal oscillator (TCXO) 935 and a flash memory 936 are connected to the baseband system unit 930.

The temperature compensated crystal oscillator (TCXO) 935 generates a reference clock signal with a substantially constant frequency irrespective of temperature. The flash memory 936 stores current position information, time-difference information, and the like. When a clocking mode or a positioning mode is set, the baseband system unit 930 performs a process of demodulating a baseband system signal from a digital signal converted by the ADC 926 of the RF unit 920. The baseband system unit 930 acquires satellite information such as the orbit information and the GPS time information included in the captured navigation message of the GPS satellite 100 and stores the satellite information in the SRAM 934.

The display unit 950 is configured to include a control unit 955 and a crystal resonator 951. The control unit 955 includes a storage unit 953, an oscillation circuit 952, and a driving circuit 954 and performs various kinds of control. The control unit 955 controls the reception module 940, transmits a control signal to the reception module 940, controls a reception operation of the reception module 940, and controls display of the liquid crystal panel 21 via the driving circuit 954 in the control unit 955. The storage unit 953 stores various kinds of information, including internal time information. The secondary battery 28 supplies energy necessary for operation or display of a circuit.

The control unit 955, the CPU 932, and the DSP 931 cooperate to calculate clocking information and positioning information and calculate information regarding a time, a current position, a movement distance, a movement speed based on such information. The control unit 955 performs control of display of such information on the liquid crystal panel 21 and control of setting or the like of an operation mode or a display mode of the electronic device 1 in response to manipulations of the push buttons 40, 41, 42, and 43 illustrated in FIGS. 1 and 2. The control unit 955 can have an advanced function of navigation of displaying a current position on a map.

C: Structure of Antenna

Next, the structure of the antenna 30 in the electronic device 1 according to the embodiment will be described with reference to FIGS. 5 to 10.

The antenna 30 according to the embodiment is an antenna for which a plate inverted F antenna or a planar inverted F antenna (PIFA). The planar inverted F antenna has a structure in which a conductive plate serving as a second electrode plate and a radiation plate serving as a first electrode plate are disposed to face each other, the conductive plate and the radiation plate are short-circuited using a short-circuit portion, and power is fed to the radiation plate by a feeding element to obtain radio radiation.

Figure 5:
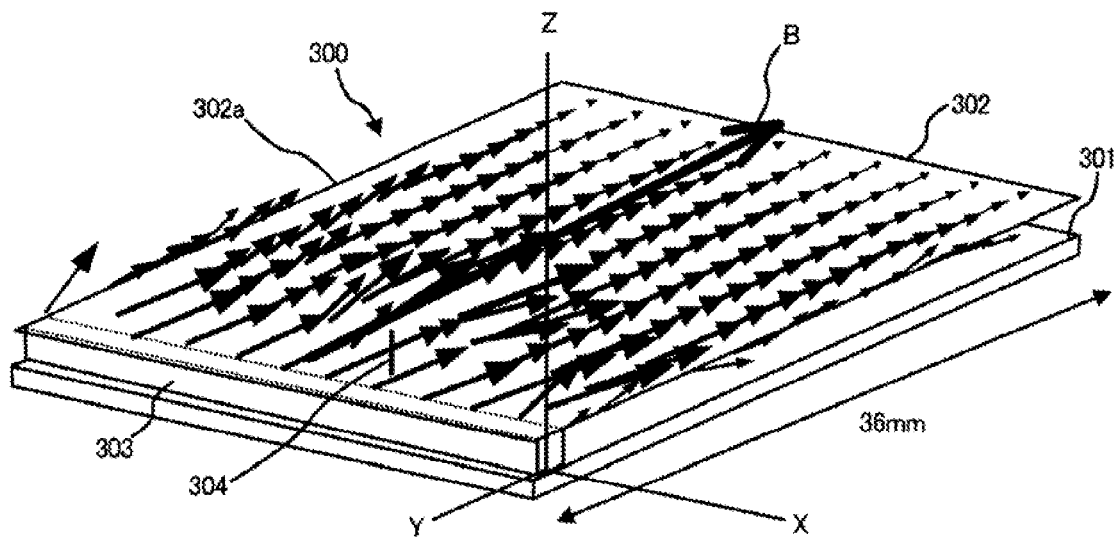
FIG. 5 is a schematic diagram illustrating the flow of a current in an antenna according to a comparative example.
Figure 6:
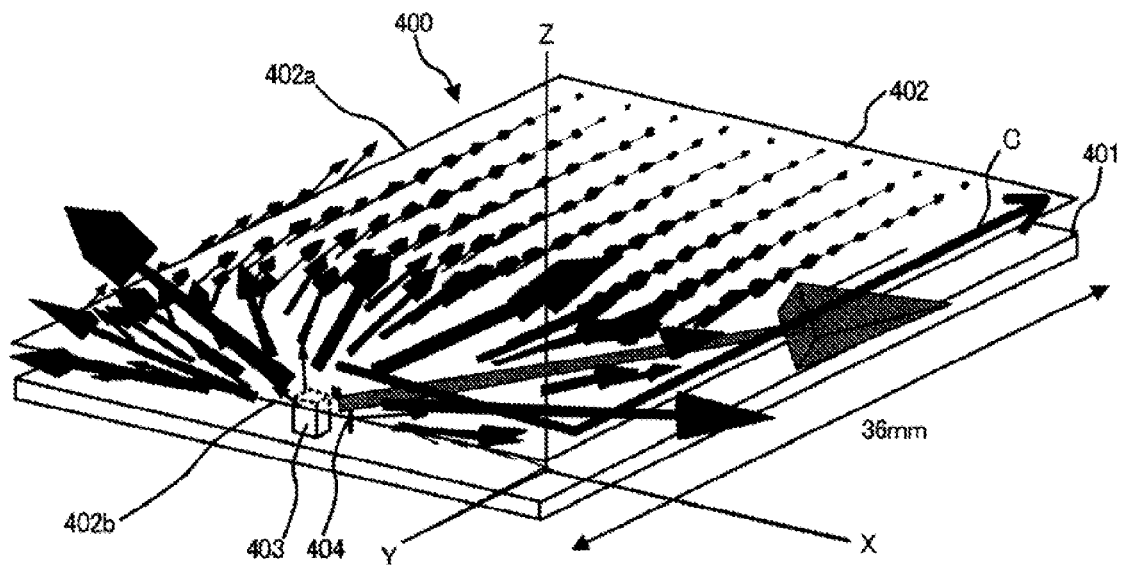
FIG. 6 is a schematic diagram illustrating the flow of a current in an antenna according to the first embodiment.

FIG. 5 is a schematic diagram illustrating the flow of a current in a planar inverted F antenna according to a comparative example. FIG. 6 is a schematic diagram illustrating the flow of a current in a planar inverted F antenna according to the first embodiment. In FIG. 5, a radiation plate 302 serving as the first electrode plate is connected to a short-circuit portion 303. In FIG. 5, a conductive plate 301 serving as the second electrode plate is connected to the short-circuit portion 303. In FIG. 5, a direction orientated along a direction intersecting a line segment that binds a position of the short-circuit portion 303 connected to the radiation plate 302 serving as the first electrode plate and a position of the short-circuit portion 303 connected to the conductive plate 301 serving as the second electrode plate is referred to as an X axis direction. In FIG. 5, a direction which is vertical to the front surface of the radiation plate 302 serving as the first electrode plate or the front surface of the conductive plate 301 serving as the second electrode plate and is vertical to the X axis direction is referred to as a Z axis direction. In FIG. 5, a direction vertical to the X axis direction and the Z axis direction is referred to as a Y axis direction. Hereinafter, in the drawings used to describe the planar inverted F antenna, a direction oriented along a direction intersecting a line segment that binds a position of the short-circuit portion 303 connected to the first electrode plate and a position of the short-circuit portion 303 connected to the second electrode plate is referred to as the X axis direction. A direction which is vertical to the front surface of the first electrode plate or the front surface of the second electrode plate and is vertical to the X axis direction is referred to as the Z axis direction. A direction vertical to the X axis direction and the Z axis direction is referred to as the Y axis direction. In FIG. 6, a direction orientated along a direction intersecting a line segment that binds a position of a short-circuit portion 403 connected to a radiation plate 402 serving as the first electrode plate and a position of the short-circuit portion connected to a conductive plate 401 serving as the second electrode plate is referred to as the X axis direction. In FIG. 6, a direction which is vertical to the front surface of the radiation plate 402 serving as the first electrode plate or the front surface of the conductive plate 401 serving as the second electrode plate and is vertical to the X axis direction is referred to as the Z axis direction. In FIG. 6, a direction vertical to the X axis direction and the Z axis direction is referred to as the Y axis direction.

In FIGS. 5 and 6, arrows (except for arrows B and C) illustrated on the radiation plates indicate the flow of a current necessary in simulation. Directions of the arrows indicate arrows of the current and the sizes of the arrows indicate the magnitudes of the current. Hereinafter, the flow of a current in the planar inverted F antenna according to the comparative example and the planar inverted F antenna according to the embodiment will be described with reference to FIGS. 5 and 6.

In a planar inverted F antenna 300 illustrated in FIG. 5 according to the comparative example, the radiation plate 302 with the same size as the conductive plate 301 is used. When viewed in the Z axis direction, the conductive plate 301 and the radiation plate 302 are disposed to be superimposed so that the positions of the conductive plate 301 and the radiation plate 302 in the X axis direction and the Y axis direction are matched. In the planar inverted F antenna 300 according to the comparative example, the short-circuit portion 303 with the same width as the width of the conductive plate 301 in the X axis direction and the width of the radiation plate 302 in the X axis direction is used. The feeding element 304 is installed near the short-circuit portion 303. In the planar inverted F antenna 300, as indicated by many arrows in FIG. 5, a current flows in parallel to a side 302a of the short-circuit portion 303 extending in the Y axis direction. Accordingly, as indicated by the arrow B, the length of the current path is equal to the length of the side 302a. Accordingly, in the planar inverted F antenna 300 according to the comparative example, $\lambda$ is a wavelength of a signal to be received and the length of a current path is set to $\lambda/4$. Then, for example, in a case in which the length of the side 302a is set to 36 mm, $\lambda/4$ is 36 mm. Accordingly, a resonance frequency of the planar inverted F antenna 300 according to the comparative example is 2.077 GHz.

Even in a planar inverted F antenna 400 illustrated in FIG. 6 according to the embodiment, the radiation plate 402 with the same size as the conductive plate 401 is used. When viewed in the Z axis direction, the conductive plate 401 and the radiation plate 402 are disposed to be superimposed so that the positions of the conductive plate 401 and the radiation plate 402 in the X axis direction and the Y axis direction are matched. However, the planar inverted F antenna 400 is different from the planar inverted F antenna 300 according to the comparative example in that the width of the short-circuit portion 403 in the X axis direction is narrower than the maximum width of the conductive plate 401 in the X axis direction and the maximum width of the radiation plate 402 in the X axis direction. Even in the planar inverted F antenna 400 according to the embodiment, a feeding element 404 is installed near the short-circuit portion 403. In the case of the planar inverted F antenna 400 according to the embodiment, as indicated many arrows in FIG. 6, a current flows radially from the position of the short-circuit portion 403. Accordingly, a current path indicated by an arrow C is a path oriented along a side 402b extending in the X axis direction from the position of the short-circuit portion 403 and subsequently along a side 402a extending in the Y axis direction, and thus is longer than the current path of the planar inverted F antenna 300 according to the comparative example. In the planar inverted F antenna 400 according to the embodiment, the length of the current path is set to $\lambda/4$. Then, in a case in which the length of the side 402a is set to 36 mm and the width of the side 402b is set to 28 mm, a current path indicated by an arrow B is 50 mm. That is, since $\lambda/4$ is 50 mm, the resonance frequency of the planar inverted F antenna 400 according to the embodiment is 1.514 GHz. Thus, as in the electronic device 1 according to the embodiment, the antenna can be an antenna that receives a positioning signal or the like through radio waves from the GPS satellites 100.

Figure 7:
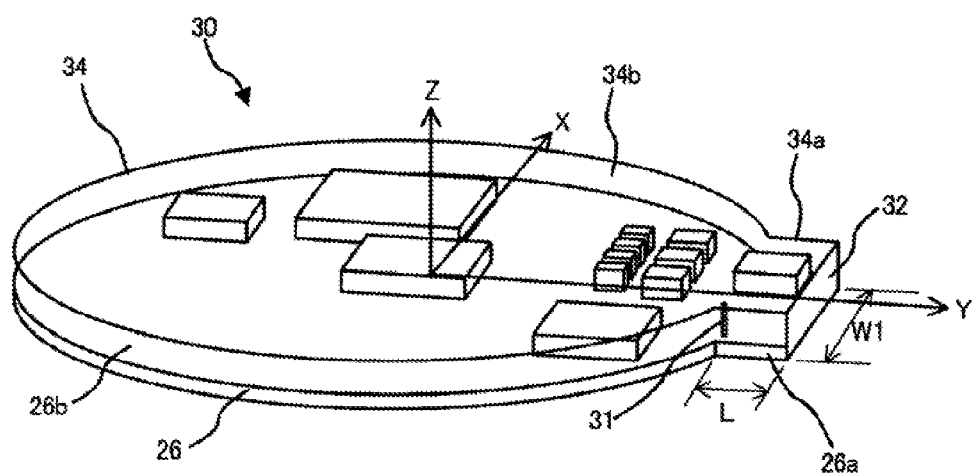
FIG. 7 is a perspective view illustrating an example of the antenna.
Figure 8:
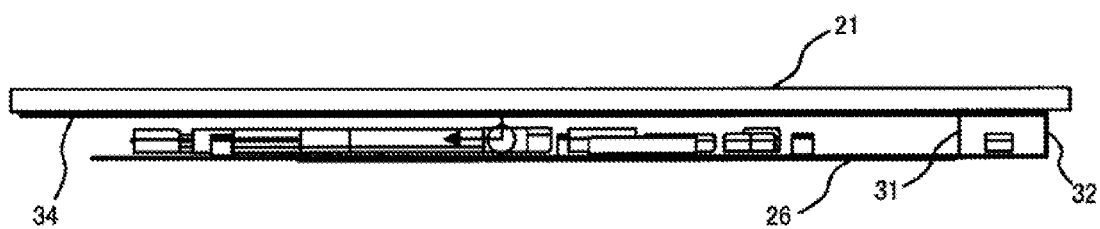
FIG. 8 is a partial sectional view illustrating an example of the antenna.

The basic structure of the antenna 30 according to the embodiment is illustrated in FIGS. 7 and 8. FIG. 7 is a perspective view illustrating the antenna 30 used in the electronic device 1 illustrated in FIG. 2. FIG. 8 is a sectional view illustrating the antenna 30. To facilitate understanding of a simulation result, the planar inverted F antenna in which the rectangular first electrode plate and the rectangular second electrode plate are used is illustrated in FIG. 6. In contrast, since it is necessary to dispose the antenna 30 used in the electronic device 1 illustrated in FIG. 2 in the case 2 having a cylindrical inner wall, the antenna 30 is a planar inverted F antenna in which the first and second electrode plates with shapes in which circular portions 26b and 34b and rectangular portions 26a and 34a are integrated are used. The antenna 30 in which the rectangular electrode plates as in FIG. 6 is disposed in the case 2. However, as will be described below, in a case in which one electrode plate is used as a circuit substrate, space use efficiency in the case is improved when the shape of the electrode plate is close to the shape of the inner wall of the case.

As illustrated in FIGS. 7 and 8, in the antenna 30, the circuit substrate 26 is used as the second electrode plate of the planar inverted F antenna, and an antenna electrode 34 also serving as a shield of the liquid crystal panel 21 is used as the first electrode plate of the planar inverted F antenna. The circuit substrate 26 and the antenna electrode 34 are connected to the short-circuit portion 32. The feeding element 31 is connected to the antenna electrode 34, and signals received by the antenna electrode 34 and the circuit substrate 26 are supplied to the circuit substrate 26. To facilitate the understanding, components of the circuit substrate 26 are projected through the antenna electrode 34 to be depicted in FIG. 7.

In the circuit substrate 26, the rectangular portion 26a which is a connection portion of the circuit substrate 26 and the short-circuit portion 32 is integrated with the circular portion 26b. In the antenna electrode 34, the rectangular portion 34a which is a connection portion of the antenna electrode 34 and the short-circuit portion 32 is integrated with the circular portion 34b. A width W1 of the short-circuit portion 32 is narrower than a diameter W2 which is a maximum width of the circular portions 26b and 34b. For example, as indicated by a dotted line in FIG. 2, the antenna 30 is disposed inside the case 2. As illustrated in FIG. 2, when the diameter W2 which is the maximum width of the circular portions 26b and 34b of the antenna 30 is compared to the width W1 of the short-circuit portion 32 which is the same as the width of the rectangular portions 26a and 34a, the width W1 of the short-circuit portion 32 is narrower than the diameter W2 which is the maximum width of the circular portions 26b and 34b. As illustrated in FIG. 2, the shape of the antenna electrode 34 serving as the first electrode plate in a plan view is substantially congruent with the shape of the display unit 20 in a plan view. The antenna electrode 34 is disposed at a position close to the display unit 20, and functions as a shield.

For example, in a case in which the diameter W2 of the circular portions 26b and 34b is 36 mm, the width W1 of the short-circuit portion 32 is set to 15 mm. The width W1 of the short-circuit portion 32 may be equal to or less than 15 mm and can be appropriately changed. In the embodiment, the width W1 of the short-circuit portion 32 is set to be narrower than the diameter W2 of the circular portions 26b and 34b of the circuit substrate 26 and the antenna electrode 34. Accordingly, a current path can be configured to be long as in the planar inverted F antenna 400 illustrated in FIG. 6, and thus the antenna size of λ/4 can be reduced without using a dielectric substance. The diameter W2 of the circular portions 26b and 34b can be appropriately changed within a range from 20 mm to 50 mm.

The width W1 of the short-circuit portion 32 is necessarily narrower than the maximum width of the antenna electrode 34 and is necessarily narrower than the maximum width of both sides of the circuit substrate 26. For example, in a case in which the maximum width of one of the antenna electrode 34 or the circuit substrate 26 is equal to or less than the width W1 of the short-circuit portion 32, the other (the other with the broader width) of the antenna electrode 34 and the circuit substrate 26 effectively functions as an antenna only with the maximum width of the one (the one with the narrower width). This is because a phenomenon in which the above-described current path is not changed does not occur.

In a case in which the circuit substrate 26 is used as the second electrode plate in the planar inverted F antenna, a resonance frequency is considerably lowered when components are mounted on the circuit substrate 26 compared to a case in which components are not mounted. For example, when a resonance frequency is measured, the resonance frequency is 1.5 GHz in a case in which components are not mounted, and the resonance frequency is 1.15 GHz in a case in which components are mounted. This occurs due to interaction between a substrate pattern of the circuit substrate 26 and the components. In this way, the resonance frequency is lowered at the time of mounting components. Therefore, even in a case in which the same resonance frequency is set, it is possible to further miniaturize the antenna.

Figure 9:
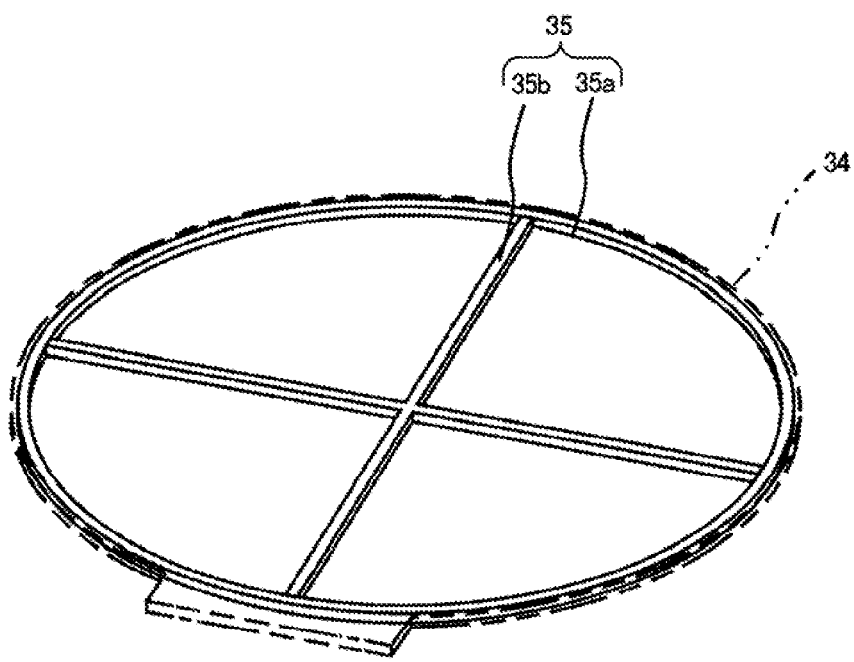
FIG. 9 is a perspective view illustrating an example of a spacer.

Next, a gap holding member of the antenna electrode 34 in the antenna 30 will be described with reference to FIG. 9. Since the antenna 30 has a structure in which a dielectric block is not put between the circuit substrate 26 and the antenna electrode 34, a gap holding structure is necessary between the circuit substrate 26 and the antenna electrode 34. In the embodiment, for example, as illustrated in FIG. 9, a spacer 35 which is a gap holding member in which an annular portion 35a and a cross portion 35b are integrated or separated is installed between the circuit substrate 26 and the antenna electrode 34. The spacer 35 is formed of, for example, a resin which has a cross-sectional rectangle with a size of 0.6 mm×0.5 mm. The cross section of the spacer 35 may be circular or the like.

In the antenna 30 according to the embodiment, the spacer 35 is installed between the circuit substrate 26 and the antenna electrode 34 and is filled with the air. In a case in which a dielectric substance is disposed in the gap between the first and second electrode plates as in the planar inverted F antenna of the related art, a dielectric tangent of the dielectric substance is not zero. Therefore, radio waves are absorbed into the electric substance, and thus antenna sensitivity deteriorates. However, in the antenna 30 according to the embodiment, since the gap between the circuit substrate 26 and the antenna electrode 34 is filled with the air with a dielectric tangent very close to zero, the antenna sensitivity can be improved more than the planar inverted F antenna of the related art in which a dielectric substance is used. Instead of the air, the space between the circuit substrate 26 and the antenna electrode 34 may be vacuumed.

D: Directivity of Antenna

Figure 10:
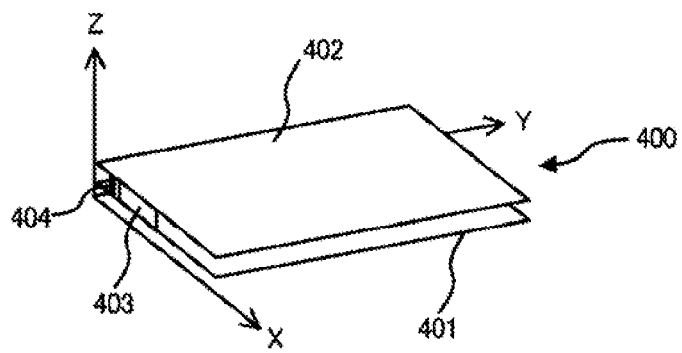
FIG. 10 is a schematic diagram illustrating an example of a planar inverted F antenna.
Figure 11:
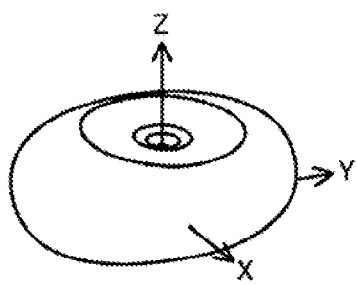
FIG. 11 is a diagram illustrating an example of directivity.
Figure 12:
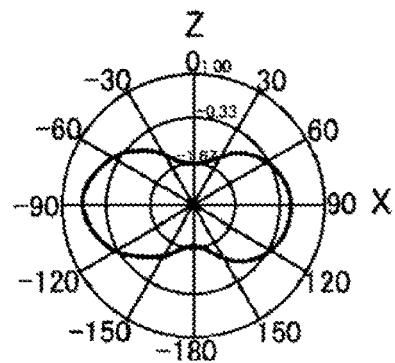
FIG. 12 is a graph illustrating an example of directivity.
Figure 13:
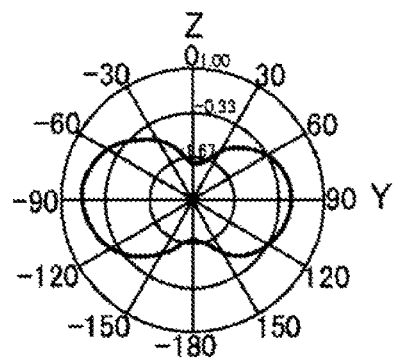
FIG. 13 is a graph illustrating an example of directivity.
Figure 14:
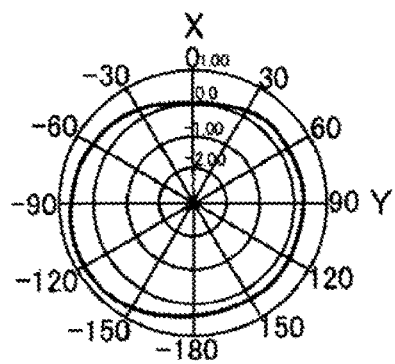
FIG. 14 is a graph illustrating an example of directivity.

Next, directivity of the antenna according to the embodiment will be described with reference to FIGS. 10 to 37. FIG. 10 is a schematic diagram illustrating the planar inverted F antenna 400 according to the embodiment in which the width of the short-circuit portion 403 in the X axis direction is narrower than the width of the conductive plate 401 and the radiation plate 402 in the X axis direction. FIG. 11 is a diagram illustrating the directivity of the planar inverted F antenna 400 illustrated in FIG. 10 3-dimensionally. FIGS. 12 to 14 are diagrams illustrating the directivity of the planar inverted F antenna 400 illustrated in FIG. 10 2-dimensionally. FIG. 12 illustrates a relation between an angle on the ZX plane and a gain of the planar inverted F antenna 400. For angles, it is assumed that a direction from the conductive plate 401 to the radiation plate 402 in a direction along the Z axis is 0 degrees, a clockwise rotation direction is positive, and a half circle is 180 degrees. Hereinafter, the angle is the same as that in the drawing in which the directivity of the antenna is indicated 2-dimensionally. In FIG. 12, gain circles indicate −1.67 dB, −0.33 dB, and 1.00 dB. FIG. 13 illustrates a relation between an angle on the ZY plane and a gain of the planar inverted F antenna 400. In FIG. 13, gain circles indicate −1.67 dB, −0.33 dB, and 1.00 dB. FIG. 14 illustrates a relation between an angle on the XY plane and a gain of the planar inverted F antenna 400. In FIG. 14, gain circles indicate −2.00 dB, −1.00 dB, 0.00 dB, and 1.00 dB.

Directivity of the planar inverted F antenna 400 illustrated in FIG. 10 is decided by a current flowing in the short-circuit portion 403. Doughnut-type directivity inflated in the X axis direction and the Y axis direction illustrated in FIGS. 11 to 14 is formed.

Figure 15:
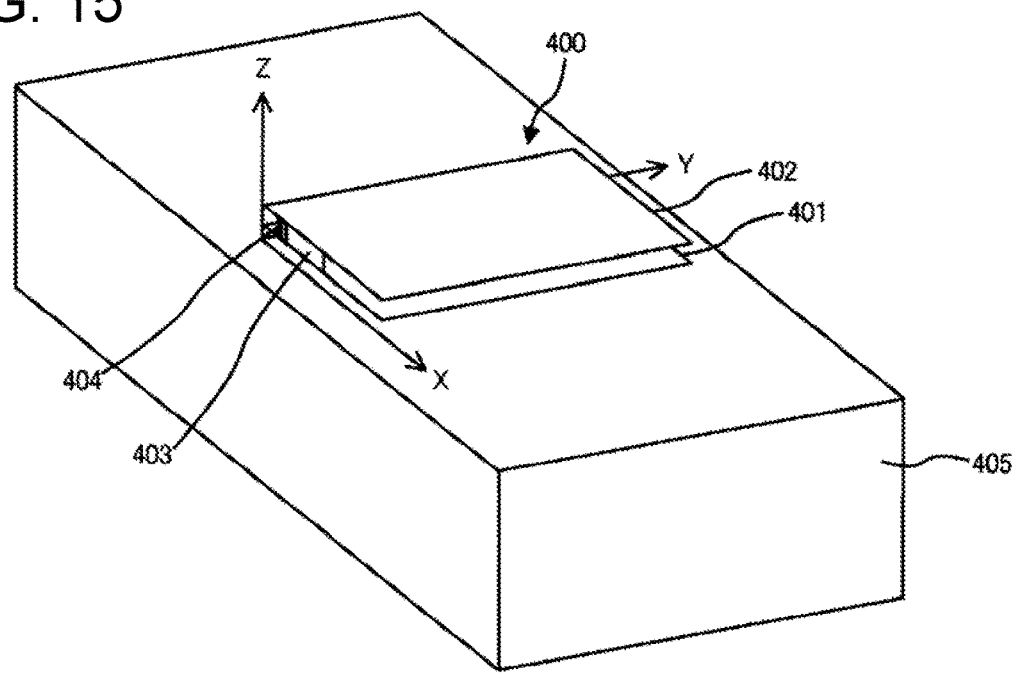
FIG. 15 is a schematic diagram illustrating a state in which an arm is present below an example of the planar inverted F antenna.
Figure 16:
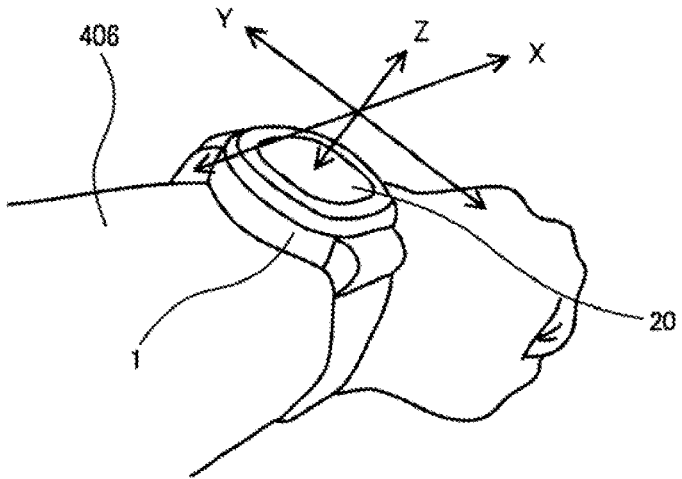
FIG. 16 is a diagram illustrating a state in which an arm is present below an example of the planar inverted F antenna.

FIG. 15 is a schematic diagram illustrating a rectangular parallelepiped 405 equivalent to an arm of the user which is present below the conductive plate 401 of the planar inverted F antenna 400 illustrated in FIG. 10 in a case in which a direction oriented in the Z axis direction is the vertical direction. The state illustrated in FIG. 15 is equivalent to a state in which the electronic device 1 is mounted on a left arm 406 of the user as in FIG. 16. In FIG. 16, a direction vertical to the surface of the display unit 20 of the electronic device 1 is referred to as the Z axis direction, a direction vertical to the Z axis direction and oriented along the longitudinal direction of the left arm 406 of the user is referred to as the X axis direction, and a direction vertical to the Z axis direction and the X axis direction is referred to as the Y axis direction. In this case, an antenna equivalent to the planar inverted F antenna 400 illustrated in FIG. 10 is assumed to be accommodated in the electronic device 1 so the antenna is parallel to the XY plane illustrated in FIG. 16.

Figure 17:
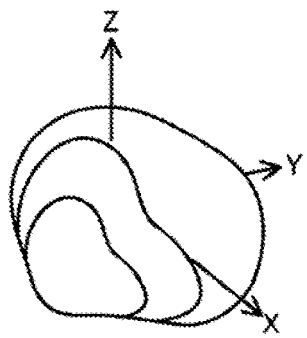
FIG. 17 is a diagram illustrating an example of directivity.
Figure 18:
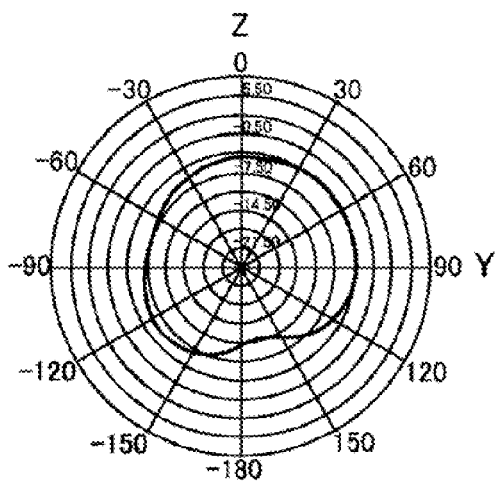
FIG. 18 is a graph illustrating an example of directivity.

FIG. 17 is a diagram illustrating the directivity of the planar inverted F antenna 400 in the state of FIG. 15 3-dimensionally. FIG. 18 is a diagram illustrating the directivity of the planar inverted F antenna 400 in the state of FIG. 15 2-dimensionally. FIG. 18 illustrates a relation between an angle on the ZY plane and a gain of the planar inverted F antenna 400. In FIG. 18, gain circles indicate −21.50 dB, −14.50 dB, −7.50 dB, and −0.50 dB.

The planar inverted F antenna 400 has no directivity in the direction oriented in the Z axis direction and the direction oriented from the conductive plate 401 to the radiation plate 402. Accordingly, in the case of FIG. 15, the sensitivity does not increase in this direction and the originally present directivity in the X axis direction and the Y axis direction remain, as illustrated in FIGS. 17 and 18.

Figure 19:
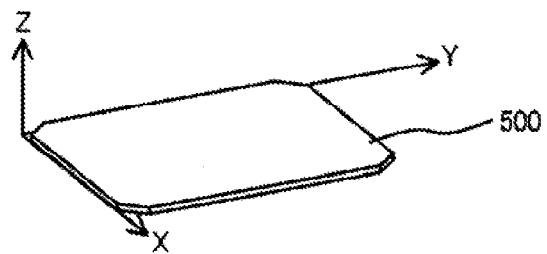
FIG. 19 is a schematic diagram illustrating an example of a patch antenna.
Figure 20:
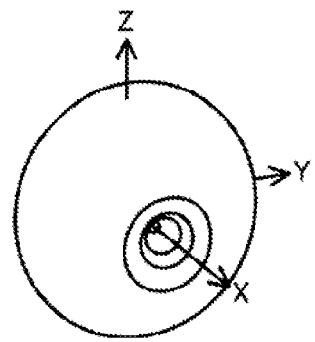
FIG. 20 is a diagram illustrating an example of directivity.
Figure 21:
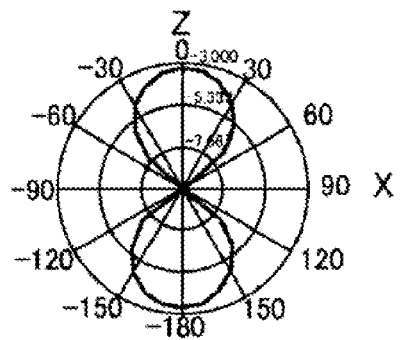
FIG. 21 is a graph illustrating an example of directivity.
Figure 22:
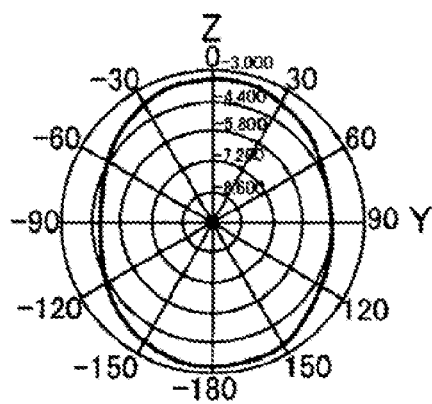
FIG. 22 is a graph illustrating an example of directivity.
Figure 23:
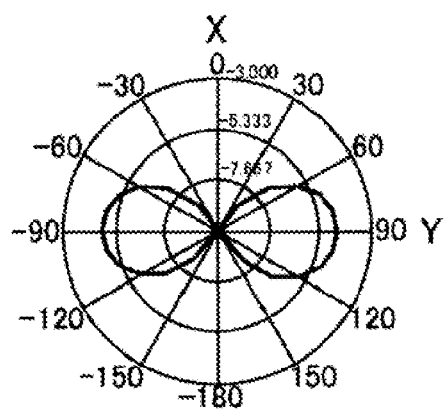
FIG. 23 is a graph illustrating an example of directivity.

FIG. 19 is a schematic diagram illustrating a patch antenna 500 of the related art. FIG. 20 is a diagram illustrating directivity of the patch antenna 500 3-dimensionally. FIGS. 21 to 23 are diagrams illustrating the directivity of the patch antenna 500 2-dimensionally. The patch antenna is a planar antenna that includes a dielectric substrate, and a radiation element and a conductive plate printed and wired on both surfaces of the dielectric substrate. FIG. 21 illustrates a relation between an angle on the ZX plane and a gain of the patch antenna 500. In FIG. 21, gain circles indicate −7.667 dB, −5.333 dB, and −3.000 dB. FIG. 22 illustrates a relation between an angle on the ZY plane and a gain of the patch antenna 500. In FIG. 22, gain circles indicate −8.600 dB, −7.200 dB, −5.800 dB, −4.400 dB, and −3.000 dB. FIG. 23 illustrates a relation between an angle on the XY plane and a gain of the patch antenna 500. In FIG. 23, gain circles indicate −7.667 dB, −5.333 dB, and −3.000 dB.

The patch antenna 500 of the related art illustrated in FIG. 19 has doughnut-type directivity inflated in the Z axis direction and the Y axis direction illustrated in FIGS. 20 to 23 because doughnut-type directivity emerges around a magnetic current flowing in a short side of the patch antenna 500 in the X axis direction.

Figure 24:
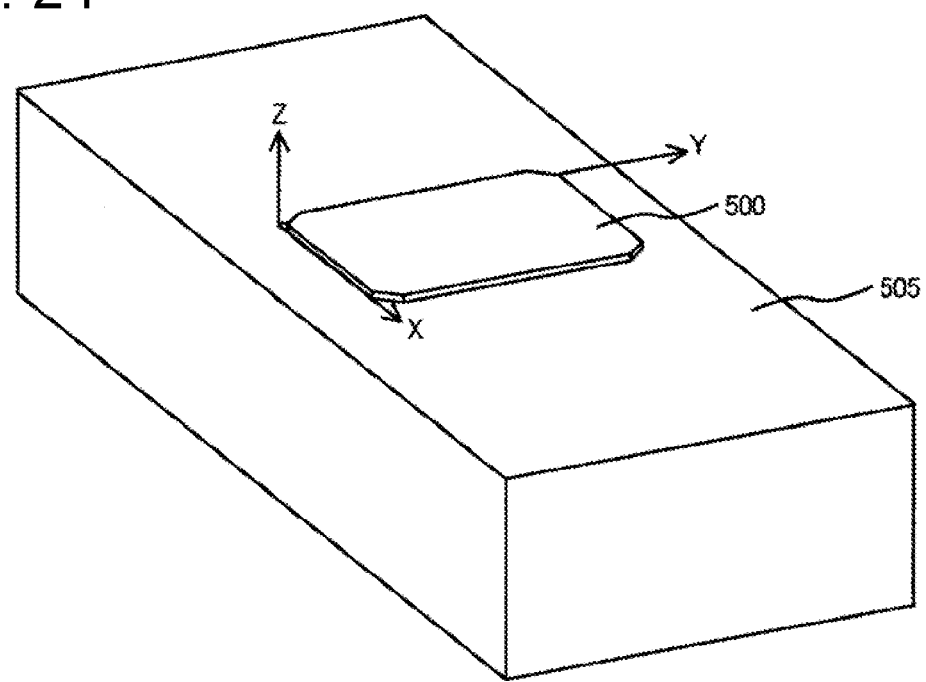
FIG. 24 is a schematic diagram illustrating a state in which an arm is present below an example of the patch antenna.
Figure 25:
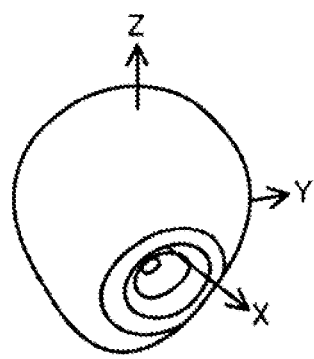
FIG. 25 is a diagram illustrating an example of directivity.
Figure 26:
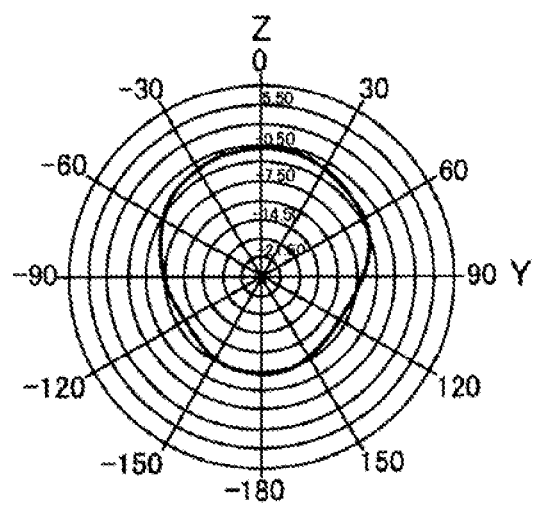
FIG. 26 is a graph illustrating an example of directivity.

FIG. 24 is a schematic diagram illustrating the rectangular parallelepiped 505 equivalent to an arm of the user which is present below the patch antenna 500 illustrated in FIG. 19 in a case in which a direction oriented in the Z axis direction is the vertical direction and corresponds to FIG. 15. FIG. 25 is a diagram illustrating the directivity of the patch antenna 500 in the state of FIG. 24 3-dimensionally. FIG. 26 is a diagram illustrating the directivity of the patch antenna 500 in the state of FIG. 24 2-dimensionally. FIG. 26 illustrates a relation between an angle on the ZY plane and a gain of the patch antenna 500. In FIG. 26, gain circles indicate −21.50 dB, −14.50 dB, −7.50 dB, −0.50 dB, and 5.50 dB.

As illustrated in FIG. 24, an arm absorbs and reflects radio waves in a case in which the arm of the user is present below the patch antenna 500 in the Z axis direction. In the patch antenna 500 of the related art, as illustrated in FIGS. 25 and 26, the upward directivity of the patch antenna 500 in the Z axis direction is emphasized, and thus strong directivity is obtained in this direction.

As described above, in a case in which the arm of the user is present below the patch antenna 500 on the lower side in the Z axis direction, the upward directivity of the patch antenna 500 in the Z axis direction is emphasized, and thus the strong directivity is obtained in this direction. However, in a case in which the arm of the user is present below the planar inverted F antenna 400 on the lower side along the Z axis direction, the planar inverted F antenna 400 has the directivity in the Y axis direction.

Such directivity can be obtained in the same way from the antenna 30 illustrated in FIGS. 2 and 7 in which the width W1 of the short-circuit portion 32 is narrower than the diameter W2 of the circular portions 26b and 34b of the circuit substrate 26 and the antenna electrode 34.

The antenna 30 has the directivity in the Y axis direction in a state in which the antenna 30 is disposed inside the electronic device 1, as illustrated in FIG. 2 and the electronic device 1 is mounted on the left arm 406 of the user, as illustrated in FIG. 16. When the user wears the electronic device 1 on his or her left arm and takes a running posture, the back of his or her hand is generally orientated in a substantially vertical direction to the direction of zenith (in other words, the thumb side of the user, that is, the radius side, is oriented in the direction of zenith). Accordingly, in regard to the electronic device 1 illustrated in FIG. 16, the Z axis direction vertical to the surface of the display unit 20 is oriented in the direction substantially vertical to the direction of zenith, and the Y axis direction vertical to the X axis direction and the Z axis direction oriented in the longitudinal direction of the left arm is oriented in the direction of zenith. It is assumed that the antenna 30 illustrated in FIGS. 2 and 7 is disposed in the electronic device 1 so that the surfaces of the antenna electrode 34 and the circuit substrate 26 of the antenna 30 are parallel to the XY plane illustrated in FIG. 16, and the user wears the electronic device 1 on his or her left arm and takes a running posture. In this case, the antenna 30 has the directivity in the Y axis direction, that is, the direction of zenith, and thus it is easy to receive radio waves from the GPS satellites 100.

However, such a planar inverted F antenna does not have doughnut-type directivity in the Y axis direction, as illustrated in FIGS. 17 and 18. For example, the directivity of the planar inverted F antenna 300 including the short-circuit portion 303 that has the same width as the width of the conductive plate 301 and the radiation plate 302 in the X axis direction, as illustrated in FIG. 5, is formed as follow.

The directivity of the planar inverted F antenna is decided by composition of the following first directivity and second directivity. The first directivity is directivity that is produced by a magnetic current along the edges of the front ends (open ends) of the first and second electrode plates in the X axis direction and spreads in a doughnut form centering on the X axis. The second directivity is directivity that is produced by a current flowing in parallel to the Z axis between the first and second electrode plates and spreads in a doughnut form centering on the Z axis.

Figure 27:
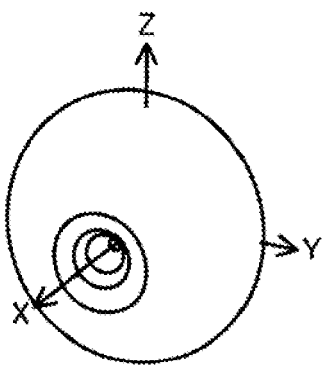
FIG. 27 is a diagram illustrating an example of directivity.

In the case of the antenna 300, the width of the short-circuit portion 303 in the X axis direction is the same as the width of the conductive plate 301 and the radiation plate 302 in the X axis direction. Therefore, the antenna 300 does not operate as a dipole antenna, and the first directivity is stronger than the second directivity. As a result, as illustrated in FIG. 27, concentric circular directivity which is strong directivity even in the Z axis direction is indicated.

In contrast, in the planar inverted F antenna 400 illustrated in FIGS. 6 and 15, a function of a dipole antenna becomes strong as the width of the short-circuit portion 403 in the X axis direction is narrower than the width of the conductive plate 401 and the radiation plate 402 in the X axis direction. As a result, the second directivity is stronger than the first directivity. As a result, as illustrated in FIGS. 17 and 18, the planar inverted F antenna 400 has doughnut-type directivity in the Y axis direction.

Accordingly, the same applies to the antenna 30 illustrated in FIGS. 2 and 7. That is, as illustrated in FIG. 7, the antenna 30 includes the rectangular portions 26a and 34a. Therefore, the length of the entire antenna 30 in the Y axis direction is longer than the diameter W2 which is the maximum width of the antenna 30 in the X axis direction by the length L of the rectangular portions 26a and 34a in the Y axis direction. That is, the antenna 30 has the same ratio as the planar inverted F antenna 400 illustrated in FIG. 15. The width W1 of the short-circuit portion 32 in the X axis direction is narrower than the diameter W2 which is the maximum width of the circular portions 26b and 34b, as illustrated in FIG. 2. Therefore, in the antenna 30, the function of a dipole antenna becomes strong and the second directivity is stronger than the first directivity. As a result, as illustrated in FIGS. 17 and 18, the planar inverted F antenna 400 has the doughnut-type directivity in the Y axis direction. Accordingly, in a case in which the electronic device 1 is mounted on the arm, as illustrated in FIG. 16, the directivity becomes strong in the Y axis direction, that is, the direction of zenith.

In a case in which the electronic device 1 is mounted on the arm, as illustrated in FIG. 16, the directivity of the antenna 30 illustrated in FIGS. 2 and 7 becomes strong in the opposite direction to the short-circuit portion 32 in the Y axis direction. The directivity becomes strong not due to an absorption effect by the surface of the arm but due to an electric field blocking effect of the side surface of the arm. Hereinafter, the electric field blocking effect will be described.

Figure 28:
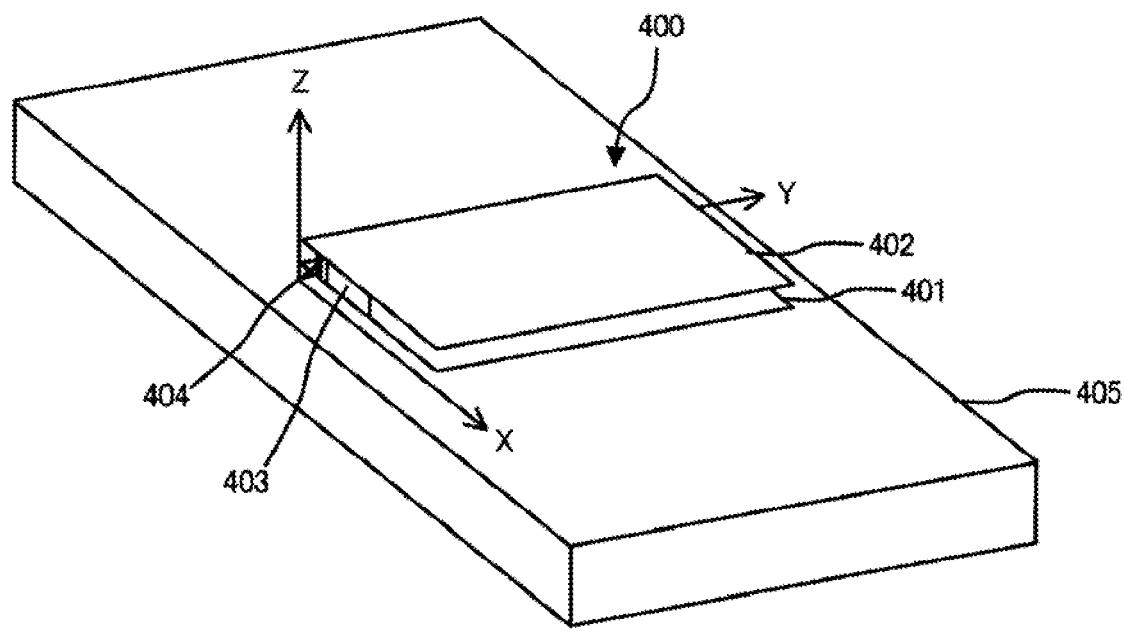
FIG. 28 is a schematic diagram illustrating a state in which an arm below an example of the planar inverted F antenna is thin.
Figure 29:
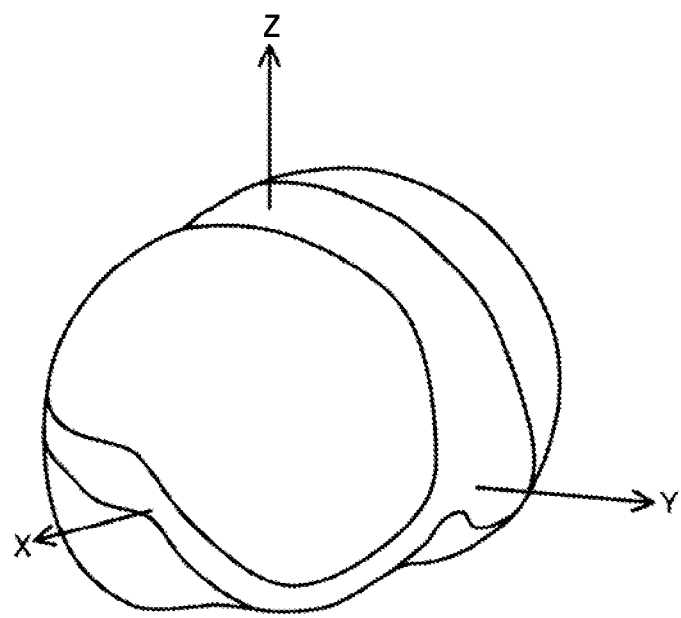
FIG. 29 is a diagram illustrating an example of directivity.

As illustrated in FIG. 28, when the thickness of the pseudo-rectangular parallelepiped 405 of the arm in the Z axis direction decreases, the directivity of the antenna 400 is oriented in the vertical direction (the Z axis direction) to the surface of the radiation plate 402 of the antenna 400, as illustrated in FIG. 29. That is, it can be understood that the directivity is not oriented in the opposite direction to the short-circuit portion 403.

Figure 30:
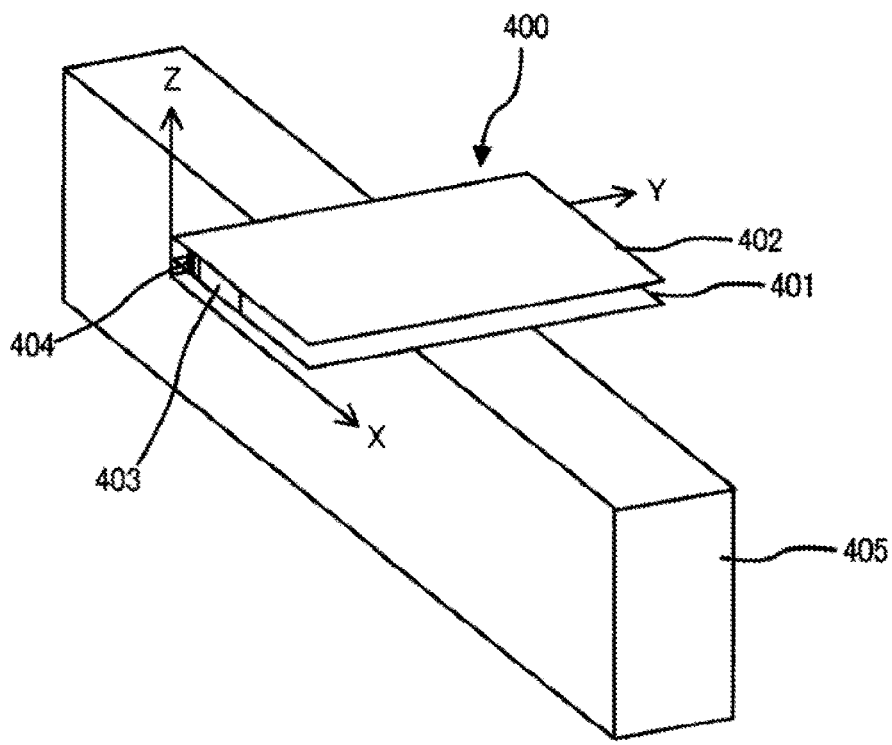
FIG. 30 is a schematic diagram illustrating a state in which the width of an arm below an example of the planar inverted F antenna is narrow.
Figure 31:
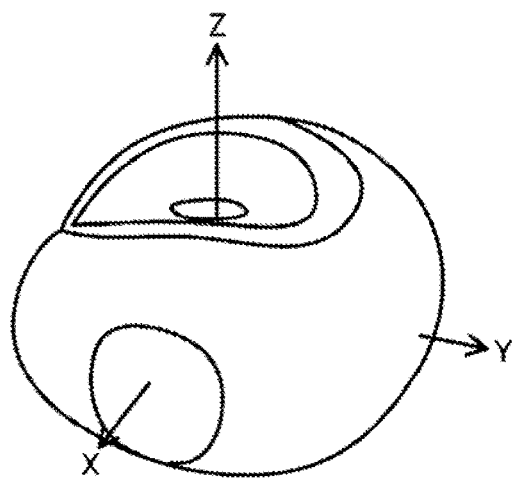
FIG. 31 is a diagram illustrating an example of directivity.

Further, in a case in which the length of the pseudo-rectangular parallelepiped 405 of the arm in the Y axis direction is shortened, as illustrated in FIG. 30, it can be understood that the directivity of the antenna 400 is oriented in the opposite direction to the short-circuit portion 403, as illustrated in FIG. 31. That is, it can be understood that the directivity oriented in the Y axis direction of the opposite direction to the short-circuit portion 403 is obtained not because of the absorption by the surface of the arm but because of the electric field blocking effect of the side surface of the arm.

Figure 32:
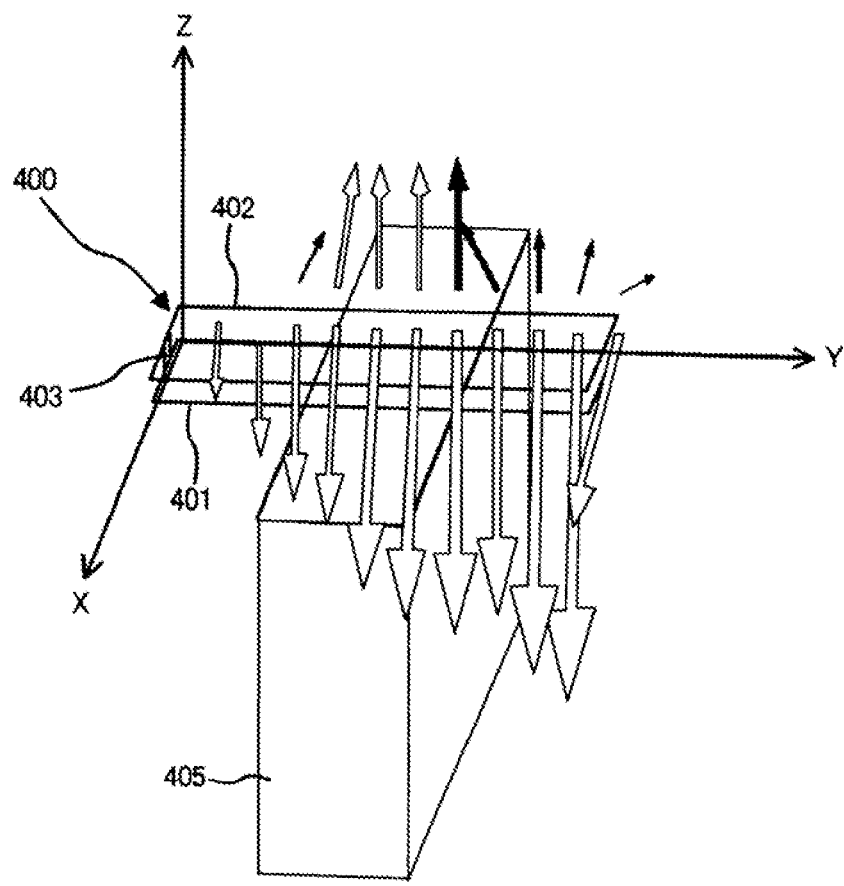
FIG. 32 is a diagram illustrating an example of an electric field.

FIG. 32 illustrates an electric field intensity distribution of the planar inverted F antenna 400. When the Z axis direction is the vertical direction, the electric field of the antenna 400 in the Y axis direction is not blocked in a case in which the arm is not present below the antenna 400. Therefore, an entire electric field intensity is the intensity of an electric field with which the electric field of the antenna 400 in the Y axis direction is composite.

In contrast, as illustrated in FIG. 32, in a case in which the pseudo-rectangular parallelepiped 405 of the arm is present below the antenna 400, the rectangular parallelepiped 405 becomes a barrier to the electric field. As a result, when the rectangular parallelepiped 405 is a boundary, an electric field outputting from a distant side than the short-circuit portion 403 in the Y axis direction is blocked not to propagate to the close side to the short-circuit portion 403. Alternatively, the electric field outputting from the close side to the short-circuit portion 403 is blocked not to propagate to the distant side than the short-circuit portion 403. As a result, in a case in which the rectangular parallelepiped 405 is present below the antenna 400, a gain in the opposite direction to the short-circuit portion 403 in the Y axis direction is increased because of presence of the arm. This principle is the same in the antenna 30 illustrated in FIG. 7. Accordingly, in a case in which the antenna 30 illustrated in FIG. 7 is used in the electronic device 1, the short-circuit portion 32 of the antenna 30 may be set to be oriented in the ground direction when the user wears the electronic device 1 on his or her arm and takes a running posture. By setting this way, it is possible to obtain the strong directivity in the direction of zenith of the opposite direction to the short-circuit portion 32. As a result, it is possible to satisfactorily receive radio waves from the GPS satellites.

Figure 33:
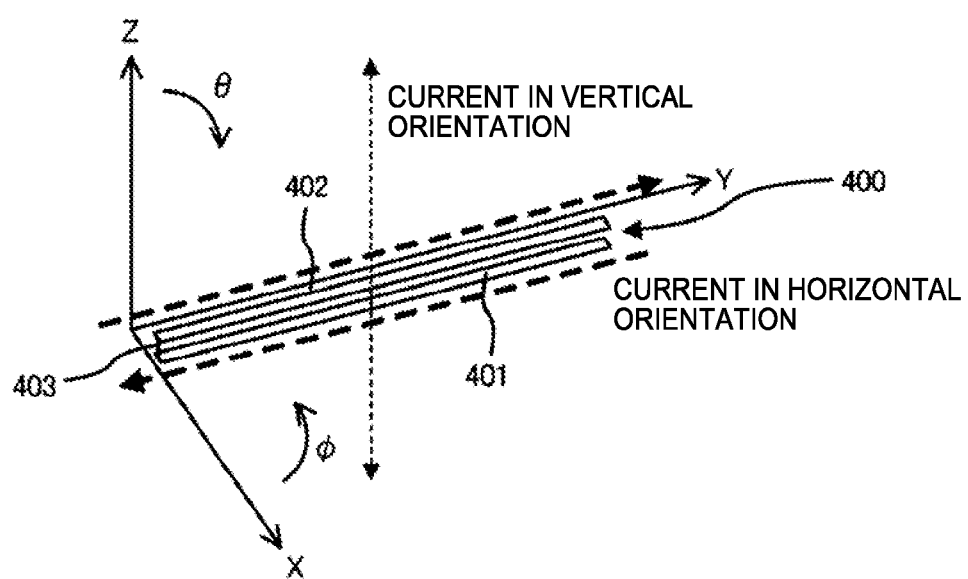
FIG. 33 is a diagram illustrating an example of the direction of a current.

Next, the decision principle of the directivity by obtaining polarization in the planar inverted F antenna according to the embodiment will be described. FIG. 33 is a diagram illustrating the direction of a current in a case in which the width of the planar inverted F antenna 400 in the X axis direction is narrow to be formed in a line form. A generation principle of the polarization is the same even when an inverted F antenna is in a line form or a planar form. Therefore, the line form of the inverted F antenna will be described. As illustrated in FIG. 33, a current in the vertical orientation of the Z axis direction and a current in the horizontal orientation of the Y axis direction flow in the planar inverted F antenna 400. The current in the vertical orientation of the Z axis direction switches in the following direction at a resonance frequency of the antenna. First, the current flows in a direction oriented from the conductive plate 401 to the radiation plate 402 in the Z axis direction (hereinafter referred to as a positive direction of the Z axis). Next, the current flows in a direction oriented from the radiation plate 402 to the conductive plate 401 in the Z axis direction (hereinafter referred to as a negative direction of the Z axis). The currents in the opposite directions are switched at the resonance frequency of the antenna. In contrast, the current in the horizontal orientation of the Y axis direction is as follows. One is a current in a direction oriented from the short-circuit portion 403 to an open end of the radiation plate 402 and the conductive plate 401 in the Y axis direction (hereinafter referred to as a positive direction of the Y axis). Another is a current in a direction oriented from the open ends of the conductive plate 401 and the radiation plate 402 to the short-circuit portion 403 in the Y axis direction (hereinafter referred to as a negative direction of the Y axis). In this way, the currents are currents in the opposite directions between the conductive plate 401 and the radiation plate 402. The directions of the currents are repeatedly reversed twice at the resonance frequency while the directions are reverse to each other. In the following description, for the X axis direction, a clockwise direction of 90 degrees in the positive direction of the Z axis is referred to as a positive direction of the X axis and a counterclockwise direction of 90 degrees in the positive direction of the Z axis is referred to as a negative direction of the X axis.

Here, how the direction of an electric field in the positive direction of the Z axis on the YZ plane is changed as a resultant vector of an electric field generated by the current will first be described. A voltage is produced between the radiation plate 402 and the conductive plate 401 by the current in the vertical orientation, and thus an electric field is produced at this position, and the electric field is radiated to a space. At this time, while the end of the antenna 400 in the positive direction of the Y axis is opened, a maximum voltage is caused, and a large electric field is radiated to the space, the radiation plate 402 and the conductive plate 401 are short-circuited at the end of the antenna 400 at which the short-circuit portion 403 is installed and an electric field is rarely radiated. At the time of focusing on the upward direction of the antenna in the positive direction of the Z axis on the YZ plane, an electric field radiated from the open end and a composite electric field generated from the current in the horizontal orientation. Vectors of the composite electric field normally rotate in the same direction on the YZ plane. When the rotating vectors of the electric field are seen from the distant side of the YZ plane, the vectors of the electric field are repeatedly reversed twice at a resonance frequency of the antenna 400 and have no components in the X direction. Therefore, a radio source of linear polarization is seen.

However, in a case in which the same vectors of the electric field are seen from a region in the positive direction of the X axis and the positive direction of the Z axis, the vectors of the electric field seem to normally rotate to the right. Therefore, in this direction, the antenna 400 operates as a right-hand circular polarization antenna. Conversely, in a case in which the same vectors of the electric field are seen from a region in the negative direction of the X axis and the positive direction of the Z axis, the vectors of the electric field seem to rotate to the left. Therefore, in this direction, the antenna 400 operates as a left-hand circular polarization antenna.

Next, how the direction of an electric field in the negative direction of the Z axis on the YZ plane is changed as a resultant vector of an electric field generated by the current will be described. A voltage is produced between the radiation plate 402 and the conductive plate 401 by the current in the vertical orientation, and thus an electric field is produced at this position, and the electric field is radiated to a space. At this time, while the end of the antenna 400 in the positive direction of the Y axis is opened and a maximum voltage is caused, and a large electric field is radiated to the space, the radiation plate 402 and the conductive plate 401 are short-circuited at the end of the antenna 400 at which the short-circuit portion 403 is installed and an electric field is rarely radiated. On the other hand, the direction of the electric field is opposite in the negative direction of the Z axis with respect to the positive direction of the Z axis. Further, for the electric field in the horizontal orientation of the Y axis direction, directions of the current contiguous in the positive direction (the upper side of the antenna) and the lower direction (the lower side of the antenna) of the Z axis are different. Therefore, the direction of the electric field is reversed. Thus, at the reverse rotation to the positive direction of the Z axis in the negative direction of the Z axis on the YZ plane, the vectors of the electric field normally rotate in the same direction. When the rotating vectors of the electric field are seen from the distant side of the YZ plane, the directions of the vectors of the electric field are repeatedly reversed twice at a resonance frequency of the antenna 400 and have no components in the X axis direction. Therefore, a radio source of linear polarization is seen.

However, in a case in which the same vectors of the electric field are seen from a region in the positive direction of the X axis and the negative direction of the Z axis, the vectors of the electric field seem to normally rotate to the left. Therefore, in this direction, the antenna 400 operates as a left-hand circular polarization antenna. Conversely, in a case in which the same vectors of the electric field are seen from a region in the negative direction of the X axis and the negative direction of the Z axis, the vectors of the electric field seem to rotate to the right. Therefore, in this direction, the antenna 400 operates as a right-hand circular polarization antenna.

In the case of the patch antenna 500 illustrated in FIG. 19, no short-circuit portion is installed as in the planar inverted F antenna. Therefore, the electric field in the reverse direction is radiated from both ends of the patch antenna 500. At this time, in the vectors of the electric field generated from both ends, vector directions overlap in the concentric circular form when viewed from the center of the patch antenna 500 such as rightward rotation→leftward rotation→rightward rotation→leftward rotation, and the like, and thus waves of the ripples are radiated to the space. At this time, reversion of the directions of the vectors of the electric field is merely repeated and the vectors of the electric field do not rotate. Accordingly, circular polarization as in the planar inverted F antenna does not occur as long as resonance in two different directions in which phases are different in the patch antenna 500 does not occur.

A mechanism for generating the foregoing circular polarization and deciding right-hand and left-hand directivity will be described from the viewpoint of overlapping of two electric fields in which an angle of the circular polarization is different at 90 degrees.

When two electric fields (magnetic fields) in which an angle is different at 90 degrees, such as an electric field (magnetic field) generated in a $\phi$ direction centering on the Z axis and an electric field (magnetic field) generated in a $\theta$ direction centering on the X axis, overlap to have a phase difference of 90 degrees, circular polarization is generated.

Figure 34:
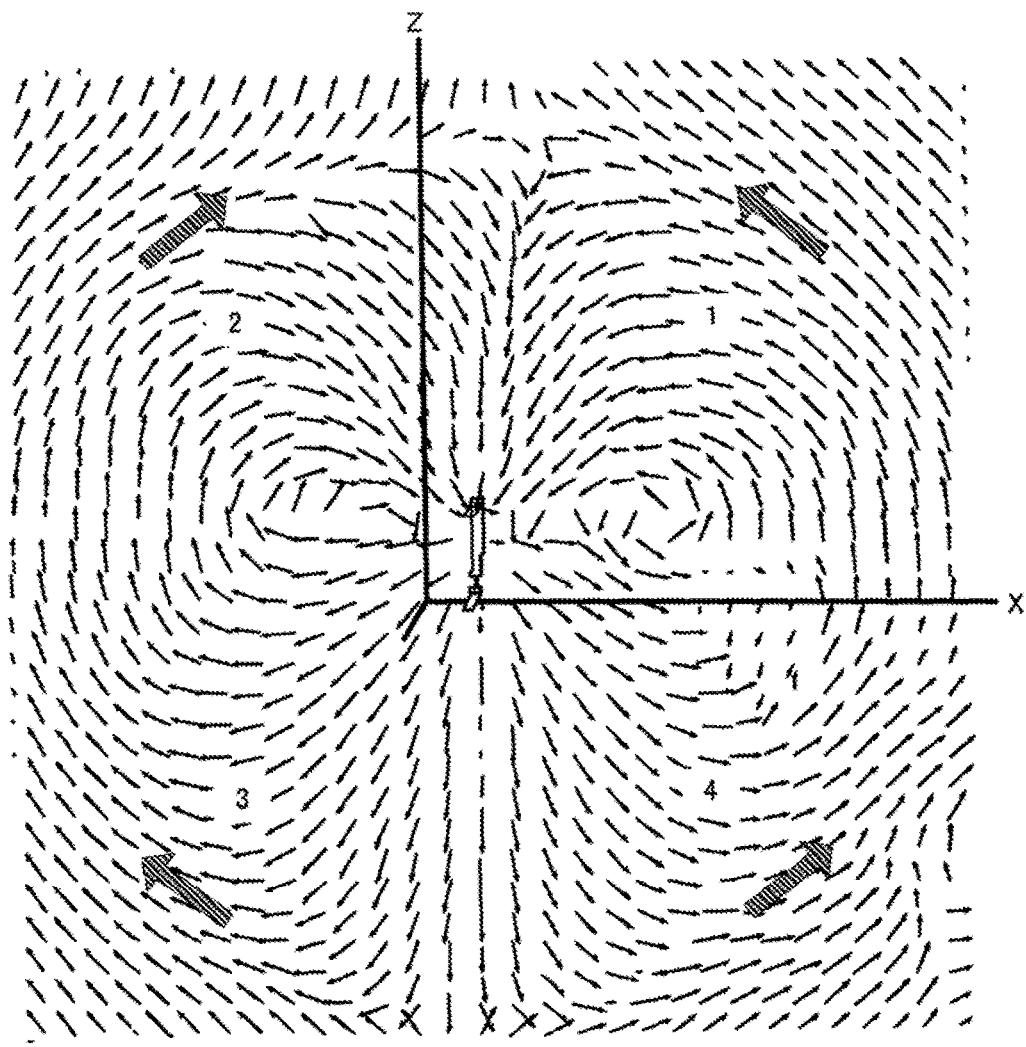
FIG. 34 is a diagram illustrating examples of electric field vectors on the XZ plane.
Figure 37:
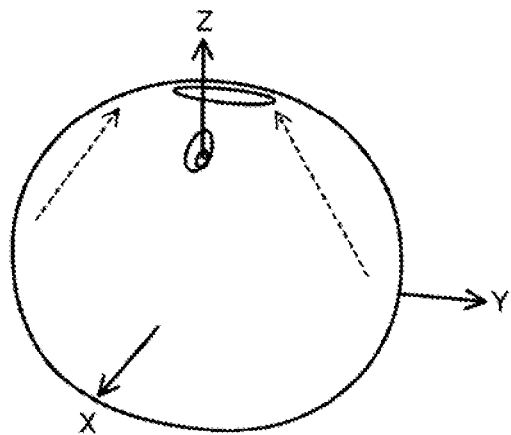
FIG. 37 is a diagram illustrating an example of directivity.

FIG. 34 is a diagram illustrating a result of a simulation of vectors of an electric field on the XZ plane. FIG. 37 is a diagram illustrating directivity in the $\theta$ direction 3-dimensionally. Slant arrows illustrated in FIG. 34 indicate directions of vectors with a representative $\theta$ component. As illustrated in FIG. 34, the direction of a vector with the $\theta$ component in a region in the positive direction of the Z axis and the positive direction of the X axis and the direction of a vector with the $\theta$ component in a region in the positive direction of the Z axis and the negative direction of the X axis are inverted. Thus, it can be understood that there is an electric field of the vectors indicated by dotted arrows in FIG. 37. When the direction of the vector is considered to be a direction of a dipole electric field parallel to the Z axis, the dipole electric field is oriented from the conductive plate 401 to the radiation plate 402 and vice versa.

Figure 35:
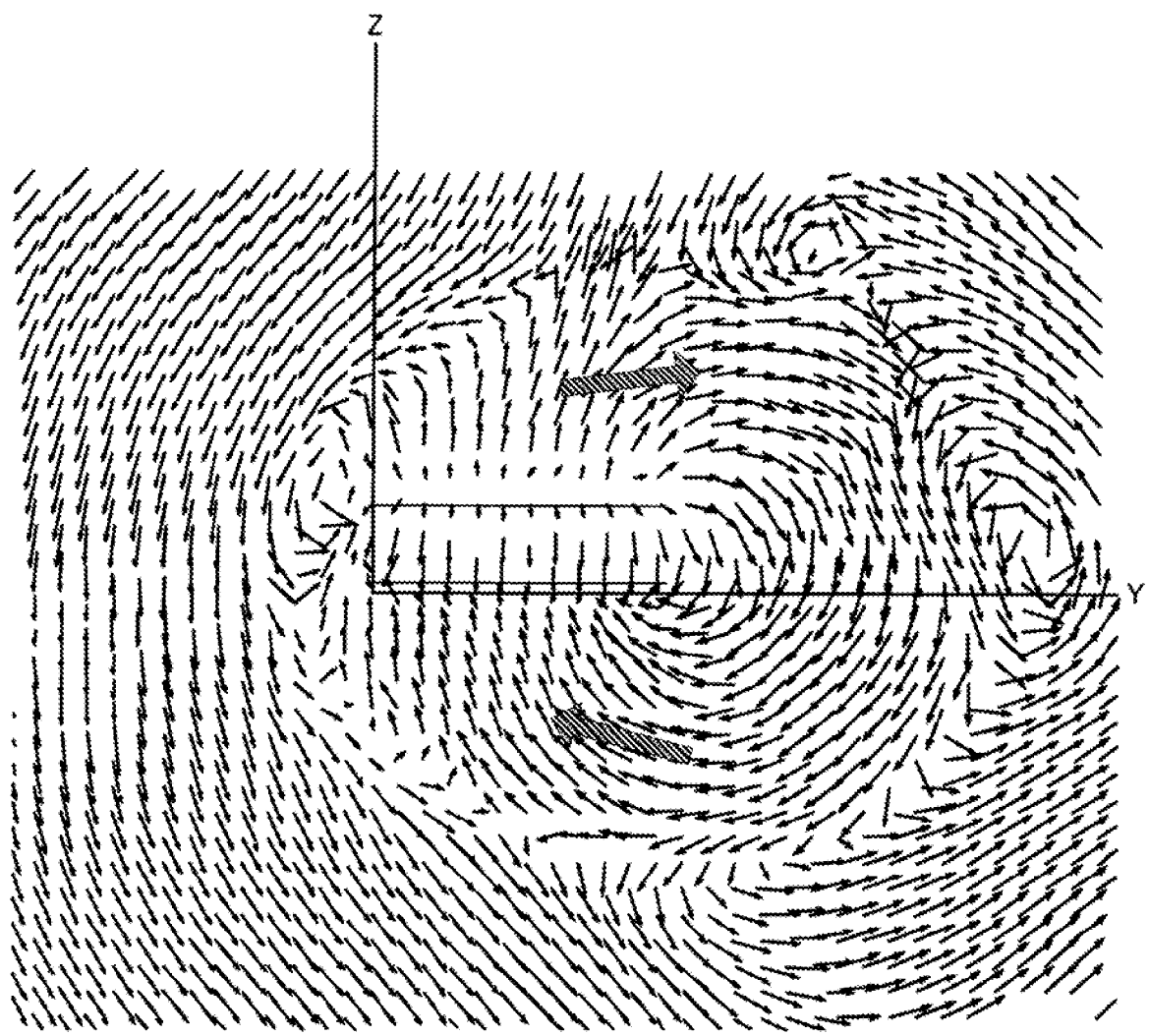
FIG. 35 is a diagram illustrating examples of electric field vectors on the YZ plane.
Figure 38:
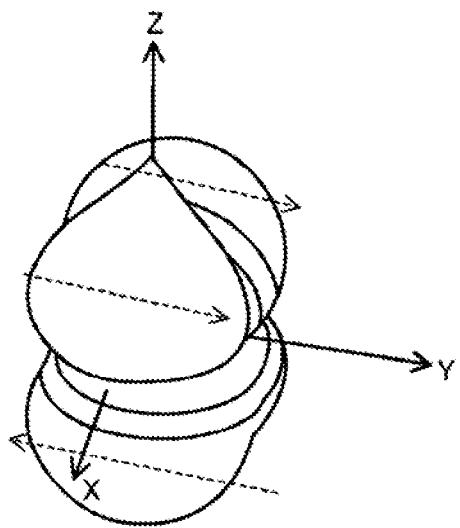
FIG. 38 is a diagram illustrating an example of directivity.

FIG. 35 is a diagram illustrating a result of a simulation of vectors of an electric field on the YZ plane. FIG. 38 is a diagram illustrating directivity in the φ direction 3-dimensionally. Slant arrows illustrated in FIG. 35 indicate directions of vectors with a representative φ component. As illustrated in FIG. 35, the direction of a vector with the φ component in a region in the positive direction of the Z axis and the positive direction of the Y axis and the direction of a vector with the φ component in a region in the negative direction of the Z axis and the positive direction of the Y axis are inverted. Thus, it can be understood that there is an electric field of the vectors indicated by dotted arrows in FIG. 38.

Figure 36:
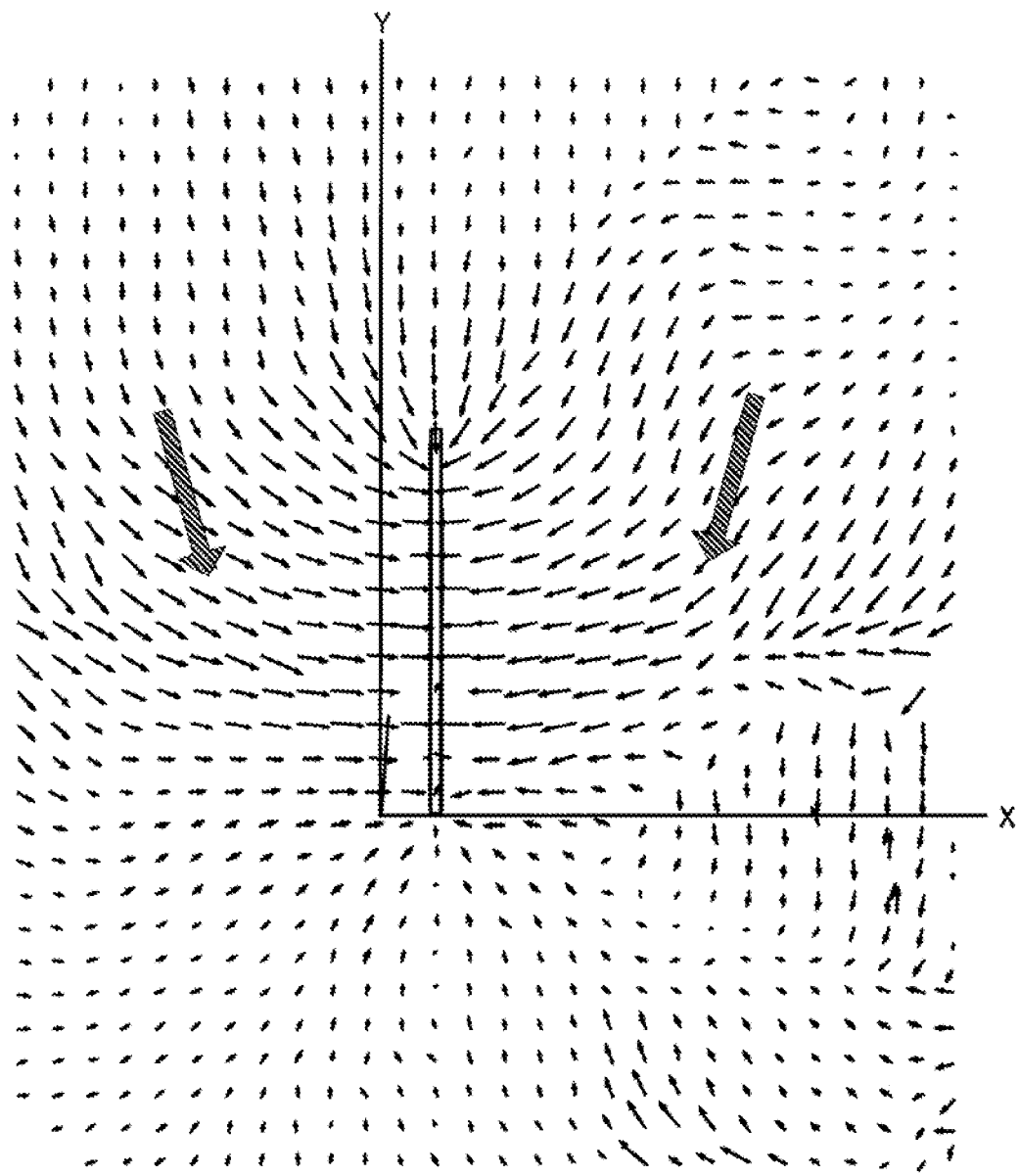
FIG. 36 is a diagram illustrating examples of electric field vectors on the XY plane.

FIG. 36 is a diagram illustrating a result of a simulation of vectors of an electric field on the XY plane. Slant arrows illustrated in FIG. 36 indicate directions of vectors with a representative φ component. As illustrated in FIG. 36, the direction of a vector with the φ component in a region in the positive direction of the Y axis and the positive direction of the X axis and the direction of a vector with the φ component in a region in the positive direction of the Y axis and the negative direction of the X axis are inverted.

The cases in which there are the regions in which combinations of the directions are different in the φ component and the θ component of the electric field have been described. However, in order to generate the circular polarization, it is necessary to deviate the phases at 90 degrees in the φ component and the θ component of the electric field. In the antenna 400, power is fed between two parallel conductive plates, the radiation plate 402 and the conductive plate 401, which is similar to the fact that power is fed to capacitors included in the first and second electrodes. The following relation is satisfied between a current I [A] flowing in a capacitor and a voltage E [V] between both ends of the capacitor.

$$I = \omega C |E| \varepsilon j^{(\theta + \pi/2)}$$

Herein, ω is an angular frequency of a signal, θ is a phase of the signal, and C is capacitance of a capacitor.

As indicated in this equation, there is a phase difference of 90 degrees between I and E. Since the θ component of the electric field is the Z axis direction, it is mainly generated by the voltage E [V] between the radiation plate 402 and the conductive plate 401 and the θ component has the same phase as E [V]. In contrast, a current in the horizontal orientation in FIG. 33 is mainly triggered, and the φ component of the electric field is generated with substantially the same phase as the current. When the foregoing mechanism is mainly used, the φ component and the θ component of the electric field have a phase difference of substantially 90 degrees. Thus, when there is a difference in the direction of substantially 90 degrees between a vector with the φ component of the electric field and a vector with the θ component of the electric field, circular polarization is generated.

The directions of the electric field with the φ component and the θ component described above are summarized for quadrants of the XZ plane illustrated in FIG. 34 as follows.

| Quadrant numbers | φ | θ | circular polarization |
|---|---|---|---|
| 1 | Left rotation orientation | upper orientation | right-hand |
| 2 | Right rotation orientation | upper orientation | left-hand |
| 3 | Right rotation orientation | lower orientation | right-hand |
| 4 | Left rotation orientation | lower orientation | left-hand |

Figure 39:
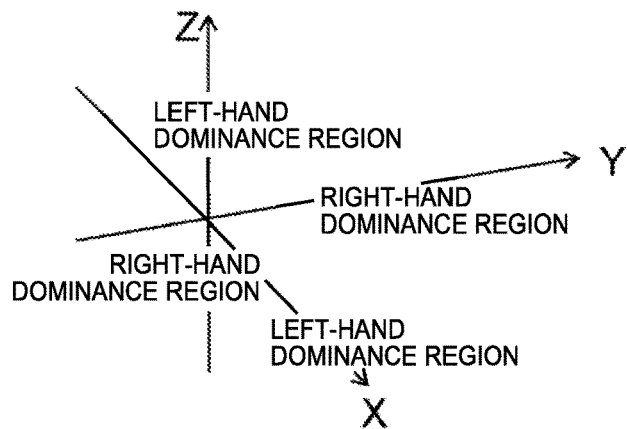
FIG. 39 is a diagram illustrating an example of a dominance region of left-hand circular polarization and right-hand circular polarization.
Figure 40:
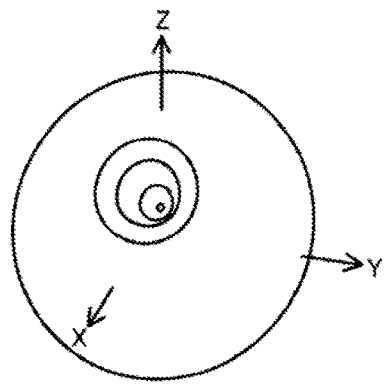
FIG. 40 is a diagram illustrating an example of directivity.
Figure 41:
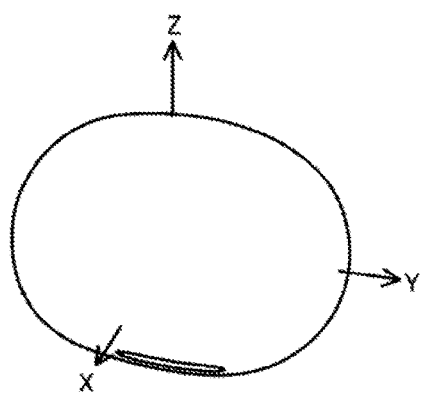
FIG. 41 is a diagram illustrating an example of directivity.

That is, as illustrated in FIG. 39, the first and third quadrants are the right-hand and the second and fourth quadrants are left-hand when viewed from the XZ plane. The left-hand indicates directivity of circular polarization illustrated in FIG. 40 and the right-hand indicates directivity of circular polarization illustrated in FIG. 41.

The directivity of circular polarization in the foregoing antenna 400 can be obtained similarly to the antenna 30 illustrated in FIG. 7. In a case in which the antenna 30 illustrated in FIG. 7 is viewed from the XZ plane, the positive direction of the X axis is right-hand dominant and the negative direction of the X axis is left-hand dominant with reference to a central line passing through the short-circuit portion 32 in the Z axis direction. Accordingly, when the user wears the electronic device 1 on his or her arm and takes a running posture, it is necessary to set the position of the short-circuit portion 32 as follows in order to maximize the directivity of circular polarization of the antenna 30 in the direction of a GPS satellite. That is, when the longitudinal direction of the arm is assumed to be the direction of the X axis, it is necessary to shift the position of the short-circuit portion 32 at 0 degrees to 90 degrees clockwise from the position of the short-circuit portion 32 illustrated in FIG. 2.

In a case in which a letter is displayed on the display unit 20 on the assumption that in a plan view of the case 2 in a direction vertical to the display unit 20 and from the side of the display unit 20, a direction oriented along a line parallel to the longitudinal direction of the band 3 is the vertical direction, angles are defined as follows. As illustrated in FIG. 2, the upper side of the letter is defined as 0 degrees, a clockwise rotation direction is defined as being positive, and one circle is defined as being 360 degrees. In this case, a part or all of the short-circuit portion 32 is disposed in a range equal to or greater than 180 degrees and equal to or less than 360 degrees in the clockwise direction of the case 2 and preferably in a range equal to or greater than 270 degrees and equal to or less than 360 degrees. The reason why 180 degrees and 360 degrees are included in the range is that directivity of right-hand circular polarization is half and directivity of left-hand circular polarization is half and 180 degrees and 360 degrees correspond to a boundary of reception performance in a case in which the position of the short-circuit portion 32 is at the angle.

In a plan view of the case 2 in the direction (the Z axis direction) vertical to the display unit 20 in a state in which the case 2 is mounted on an arm or a wrist of the user using the band 3, as illustrated in FIG. 16, angels can be defined as follows. A side oriented to a little finger of the user from a center of the case is defined as 0 degrees in a straight line parallel to the longitudinal direction (the Y axis direction) of the band 3 and passing through the center of the case 2, a clockwise rotation direction is defined as being positive, and one circle is defined as 360 degrees. In this case, a part or all of the short-circuit portion 32 is disposed in a range equal to or greater than 180 degrees and equal to or less than 360 degrees in the clockwise direction of the case 2 and preferably in a range equal to or greater than 270 degrees and equal to or less than 360 degrees.

The reason why 180 degrees and 360 degrees are included in the range is that directivity of right-hand circular polarization is half and directivity of left-hand circular polarization is half and 180 degrees and 360 degrees correspond to a boundary of reception performance in a case in which the position of the short-circuit portion 32 is at the angle.

Here, the "center of the case 2" means the center of a rectangular parallelepiped coming into contact with the front surface, the rear surface, the left side surface, the right side surface, the top surface, and the bottom surface of the case 2.

In other words, the position of the short-circuit portion can also be defined as follows. Suppose that on the plane which includes a straight line parallel to the longitudinal direction of the band 3 and is vertical to the display unit 20 in a state in which the case 2 is mounted on an arm or a wrist of the user using the band 3, the case 2 is bisected so that the volumes on the palmar side and the shoulder side are the same. In this case, the short-circuit portion 32 is disposed so that a part or all of the short-circuit portion 32 is included on the shoulder side.

Figure 42:
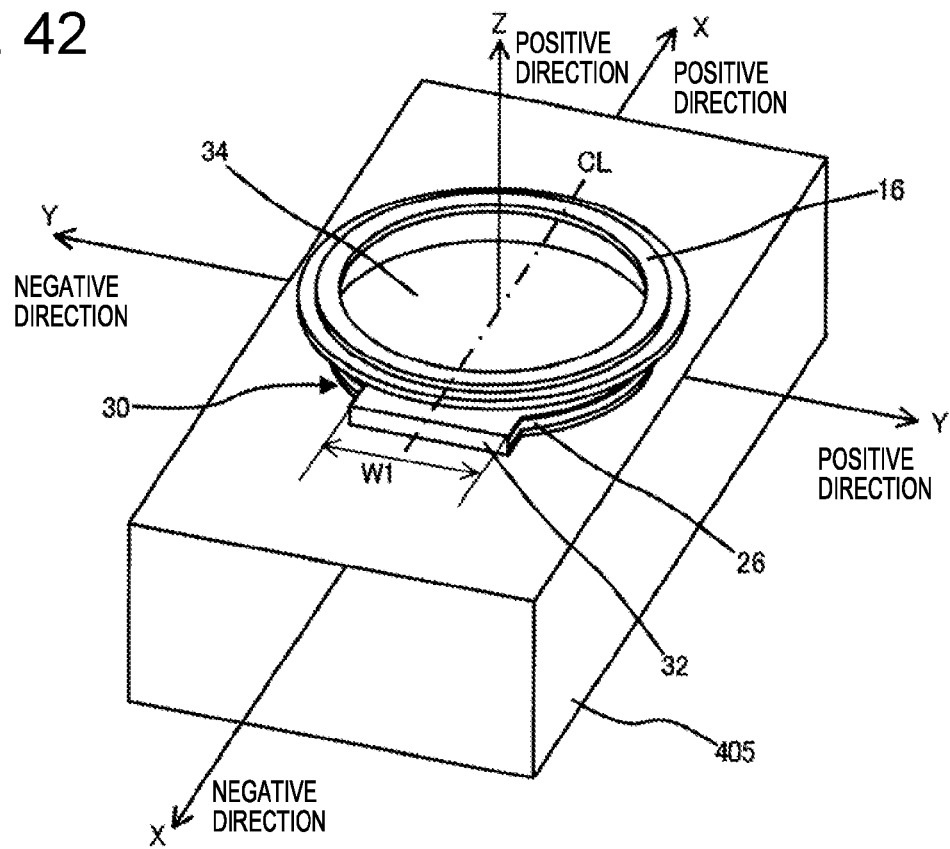
FIG. 42 is a diagram illustrating an example of the position of a short-circuit portion.
Figure 43:
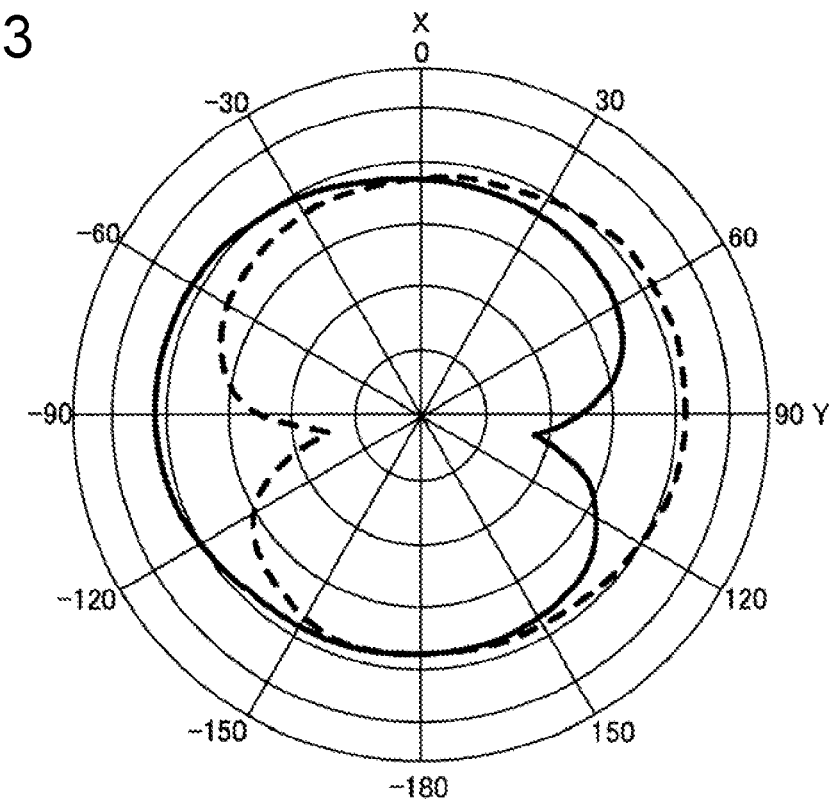
FIG. 43 is a graph illustrating an example of directivity.

FIG. 42 illustrates an example in which the short-circuit portion 32 of the antenna 30 illustrated in FIG. 7 is shifted at 90 degrees counterclockwise from the position illustrated in FIG. 2. In this case, directivity of the circular polarization is illustrated in FIG. 43. A curve indicated by a solid line is directivity of left-hand circular polarization and a curve indicated by a dotted line is directivity of right-hand circular polarization. The antenna 30 is fitted inside the case 2 of the electronic device 1 illustrated in FIG. 16 so that the cross section of the short-circuit portion 32 intersects the X axis direction of the electronic device 1. In this case, as illustrated in FIG. 16, when the user wears the electronic device 1 on his or her left arm 406 and takes a running posture, the antenna 30 can obtain strong directivity of right-hand circular polarization in the Y axis direction of the electronic device 1, that is, the direction of zenith. Accordingly, in a case in which the user is running, the antenna 30 can receive radio waves from GPS satellites with high sensitivity.

Next, an improvement in an axial ratio of circular polarization in the antenna 30 illustrated in FIG. 42 will be described. In FIG. 42, a direction oriented from the antenna electrode 34 to the bezel 16 in the Z axis is referred to as a positive direction of the Z axis. A direction rotated at 90 degrees clockwise from the positive direction of the Z axis on the ZY plane is referred to as a positive direction of the Y axis. A direction rotated at 90 degrees counterclockwise from the positive direction of the Z axis on the ZY plane is referred to as a negative direction of the Y axis. A direction rotated at 90 degrees clockwise from the positive direction of the Z axis on the ZX plane is referred to as a positive direction of the X axis and a direction rotated at 90 degrees counterclockwise from the positive direction of the Z axis on the ZX plane is referred to as a negative direction of the X axis (hereinafter the same applies to FIGS. 44 and 45). Further, when a straight line which is along the X axis and bisects the short-circuit portion 32 with the width W1 is a central line CL of the antenna 30, right-hand circular polarization (RHCP) is generated in the positive direction side of the Y axis in FIG. 42 than the central line CL in the antenna 30. Further, left-hand circular polarization (LHCP) is generated in the negative direction side of the Y axis than the central line CL. The ratio is 1:1. However, in a case in which radio waves are emitted from a GPS satellite, right-hand circular polarization is generated. Therefore, by increasing the ratio in the positive direction side of the Y axis in FIG. 42 than the central line CL, it is possible to obtain high sensitivity.

Figure 44:
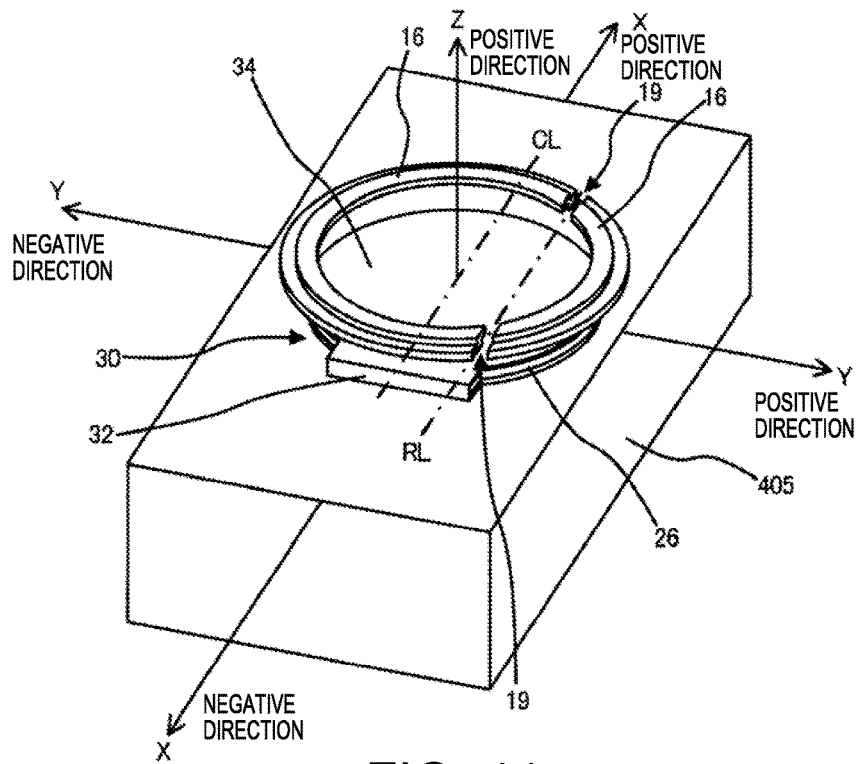
FIG. 44 is a diagram illustrating an example of a bezel in which cutouts are formed.

Therefore, as illustrated in FIG. 44, for example, two incisions 19 may be formed in the bezel 16 made of, for example, metal. In the example of FIG. 44, the incisions 19 are installed in the positive direction side of the Y axis in FIG. 44 than the central line CL of the antenna 30.

Figure 45:
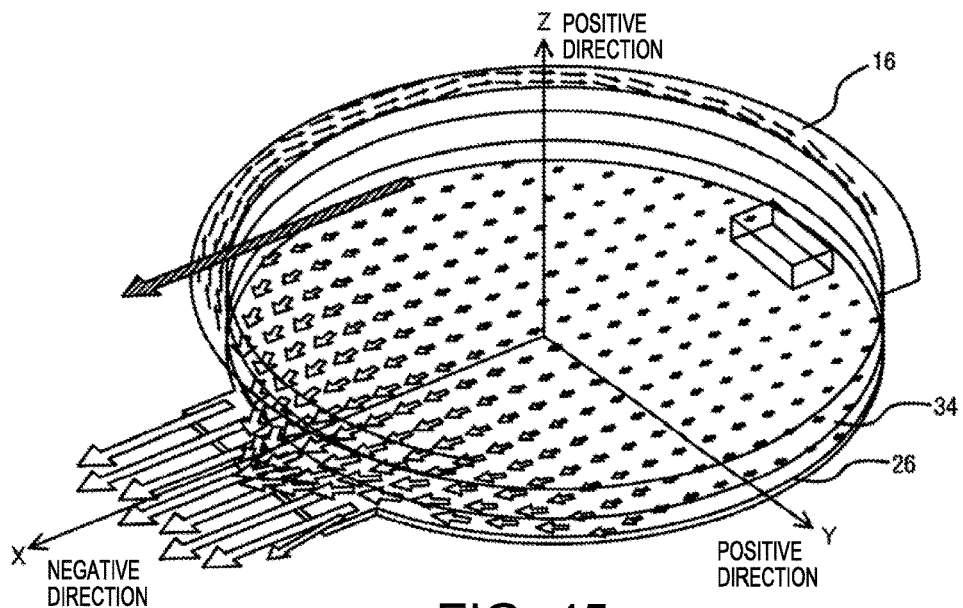
FIG. 45 is a diagram illustrating an example of the flow of a current.

When the incisions 19 are formed to segment the bezel 16 in this way, a main directivity direction is shortened. As illustrated in FIG. 44, when a line parallel to the central line CL and passing through the two incisions 19 is a reference line RL, a current in a direction in which the current of the body of the antenna 30 is cancelled flows in a long portion of the bezel 16 in the negative direction side of the Y axis than the reference line RL, as illustrated in FIG. 45. The magnitude of the current is greater than that of a short portion of the bezel 16 in the positive direction side of the Y axis than the reference line RL. The current in the direction in which the current of the body of the antenna 30 is cancelled can cancel a current component (a component indicated by a slant-shaped arrow in FIG. 45) generating unnecessary left-hand circular polarization, and thus can emphasize the right-hand circular polarization.

An effect of cancelling the current component generating the left-hand circular polarization in the short portion of the bezel 16 illustrated in FIG. 44 is great. However, the effect can be obtained only in the long portion of the bezel 16 even when the short portion of the bezel 16 is removed. In this case, the bezel 16 can be said to have one incision 19. In the invention, when the positive direction of the X axis of the central line CL illustrated in FIG. 44 is 0 degrees and one circle of the bezel 16 is 360 degrees, at least one incision 19 may be formed at a position equal to or greater than 0 degrees and equal to or less than 180 degrees.

In a case in which the left-hand circular polarization is desired to be received by the antenna 30, the incision 19 may be formed at an intersection position of the bezel 16 and the line parallel to the central line of the antenna 30 in the negative direction side of the Y axis with reference to the central line of the antenna 30.

Next, a position at which the antenna 30 is incorporated in the electronic device 1 will be described. In regard to the incorporated position, the following patterns are considered. Here, the liquid crystal panel 21, the circuit substrate 26, and the secondary battery 28 are included as structure elements of the electronic device 1. In the plan view of the case 2 in the direction vertical to the display unit 20 from the side of the display unit 20, the liquid crystal panel 21, the circuit substrate 26, and the secondary battery 28 are assumed to be disposed in order.

First pattern: the liquid crystal panel 21—the antenna 30—the circuit substrate 26

Second pattern: the circuit substrate 26—the antenna 30—the secondary battery 28

Third pattern: the liquid crystal panel 21—the first electrode plate—the circuit substrate 26—the second electrode plate—the secondary battery 28

Fourth pattern: the liquid crystal panel 21—the first electrode plate—the circuit substrate 26—the secondary battery 28—the second electrode plate By setting the position of the short-circuit portion in the following way in the first, second, and third patterns, it is possible to improve the sensitivity of the antenna 30 and stabilize the performance. Many wirings are connected between the liquid crystal panel 21 and the circuit substrate 26 to control the liquid crystal panel 21 from the circuit substrate 26. There is parasitic capacitance between the first electrode plate of the antenna 30 and the liquid crystal panel 21 or between the first electrode plate of the antenna 30 and the circuit substrate 26. Thus, potentials of the first electrode plate and the second electrode plate included in the antenna 30 may leak via the parasitic capacitance and the signal cable, thereby deteriorating the sensitivity. To suppress the deterioration in the sensitivity, the positions of the short-circuit portion 32 of the antenna 30 and the wiring are matched. Thus, the signal cable is shielded in the short-circuit portion 32, and thus the deterioration in the sensitivity does not occur. When the wiring is disposed at a position overlapping the short-circuit portion 32 in a plan view of the case 2 in the direction vertical to the display unit 20 and from the side of the display unit 20, the shielding effect can be exerted. When the wiring is disposed at a position between the short-circuit portion 32 and the case 2 in a sectional view vertical to the display unit 20, the shielding effect can be exerted.

Second Embodiment

Next, a second embodiment of the invention will be described with reference to FIGS. 46 to 60. In the following description, the same reference numerals are given to common configurations as those of the first embodiment and the repeated description will be omitted.

Figure 46:
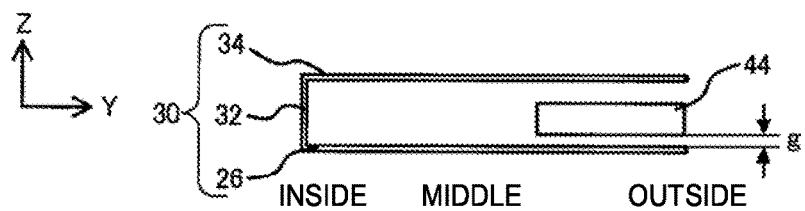
FIG. 46 is a diagram illustrating an example of a positional relation between an IC circuit and a short-circuit portion according to a second embodiment.

In the embodiment, radiation efficiency is obtained by executing a simulation in a case in which a gap between the circuit substrate 26 and the IC circuit 44 is changed and the position of the IC circuit 44 in the Y axis direction is changed in the planar inverted F antenna 30 illustrated in FIG. 7. FIG. 46 is a schematic diagram illustrating a gap g between the circuit substrate 26 and the IC circuit 44 and the position of the IC circuit 44 in the Y axis direction. In FIG. 46, when the Z axis direction is the vertical direction and a direction oriented from the circuit substrate 26 to the antenna electrode 34 is an upward direction, the gap g is a gap between the upper surface of the circuit substrate 26 and the lower surface of the IC circuit 44.

In the embodiment, as illustrated in FIG. 46, it is assumed that the vicinity of an open end of the antenna electrode 34 and the circuit substrate 26 in the Y axis direction is the outside, the side on which the short-circuit portion 32 is installed is the inside, and the intermediate portion of the outside and the inside is a middle.

Figure 47:
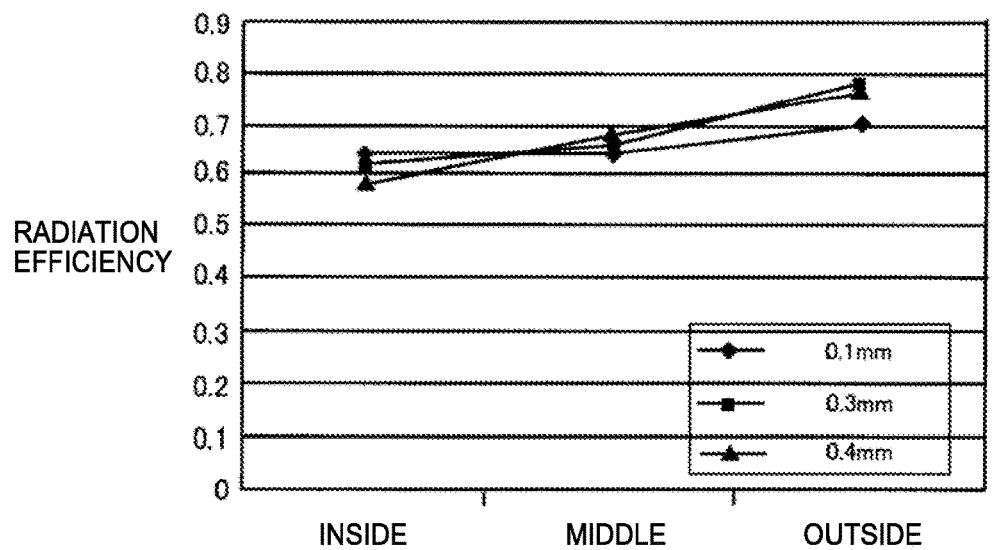
FIG. 47 is a graph illustrating an example of a relation between radiation efficiency and a positional relation of an IC circuit with respect to the short-circuit portion.
Figure 48:
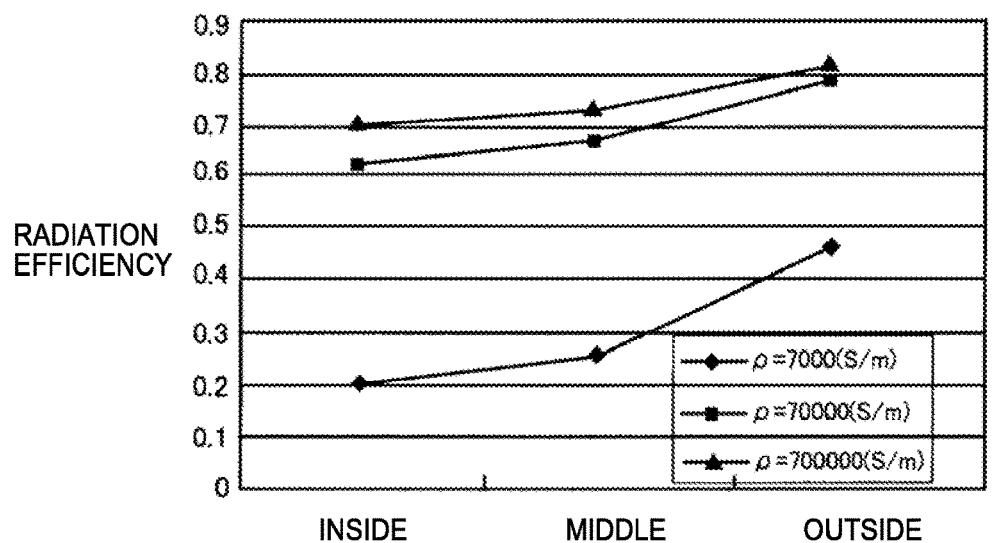
FIG. 48 is a graph illustrating an example of a relation between radiation efficiency and a positional relation of an IC circuit with respect to the short-circuit portion.

In the embodiment, radiation efficiency was obtained by executing a simulation when the gap g between the circuit substrate 26 and the IC circuit 44 illustrated in FIG. 46 was changed to 0.1 mm, 0.3 mm, and 0.5 mm and the position of the IC circuit 44 was changed to the outside, the middle, and the inside. The result is illustrated in FIG. 47. The radiation efficiency was obtained by executing a simulation when a resistance value of the IC circuit 44 was changed to 7,000 (S/m), 70,000 (S/m), and 700,000 (S/m) and the position of the IC circuit 44 was changed to the outside, the middle, and the inside. The result is illustrated in FIG. 48. The simulation was executed treating the IC circuit 44 equivalently as a graphite mass.

As illustrated in FIGS. 47 and 48, it can be understood that the radiation efficiency is improved when the IC circuit 44 is disposed in the outside. As illustrated in FIG. 47, when the gap g between the IC circuit 44 and the circuit substrate 26 is close, the capacitance between the IC circuit 44 and the circuit substrate 26 increases, and thus a state in which the IC circuit 44 and the circuit substrate 26 are connected is nearly realized. At this time, the IC circuit 44 becomes close to the same state as the capacitor 60 illustrated in FIG. 55 to be described below, and thus an inclination of the graph decreases. Further, as illustrated in FIG. 48, it can be understood that the radiation efficiency increases as the resistance value of the IC circuit 44 is larger.

The reason why these graphs rise to the right is that a current distribution of the antenna 30 decreases on the outside of the circuit substrate 26. A current proportional to a current of a resistance value s in an opposite direction to flow of a current flowing on the front surface of the facing circuit substrate 26 flows on the lower surface of components mounted on the circuit substrate 26. At this time, since the front surface of the IC circuit 44 has electric resistance, the current flowing on the front surface generates heat and a loss occurs. Since the loss is smaller on the outside of the circuit substrate 26, the radiation efficiency is improved.

Figure 49:
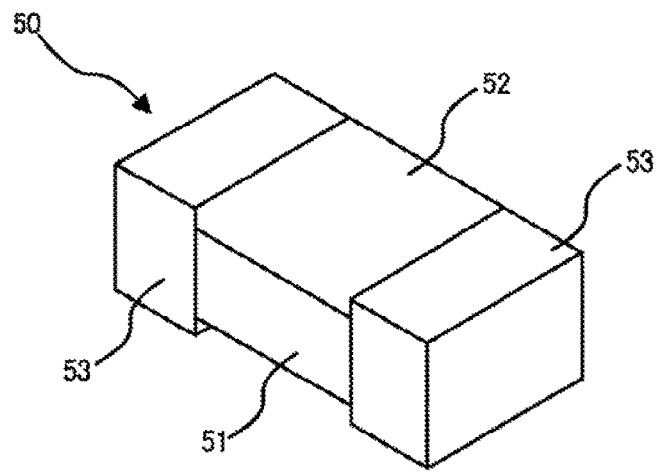
FIG. 49 is a schematic diagram illustrating an example of the configuration of a resistor.
Figure 50:
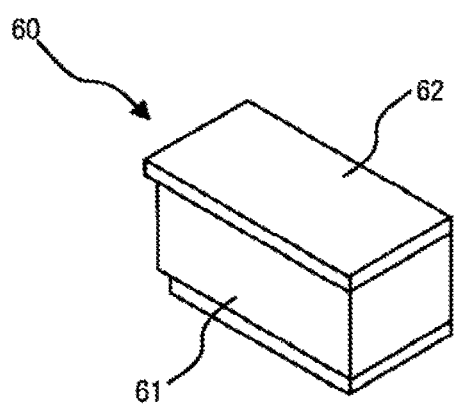
FIG. 50 is a schematic diagram illustrating an example of the configuration of a capacitor.

Next, results examined in regard to a resistor and a capacitor which are other components will be described. FIG. 49 illustrates a model of a resistor 50 used at the time of the examination. The resistor 50 includes a graphite 52 on an alumina 51 and is attached to the circuit substrate 26 by solders 53. The size is assumed to be 1.0 mm×0.5 mm. FIG. 50 illustrates a model of a capacitor 60 used at the time of the examination. The capacitor 60 has a structure in which a plate of a dielectric substance 62 is placed on a mass of rectangular parallelepiped copper 61. At the time of the examination, a dielectric constant of the dielectric substance 62 is set to 100. The size of the dielectric substance is set to 1.6 mm×0.8 mm.

Figure 51:
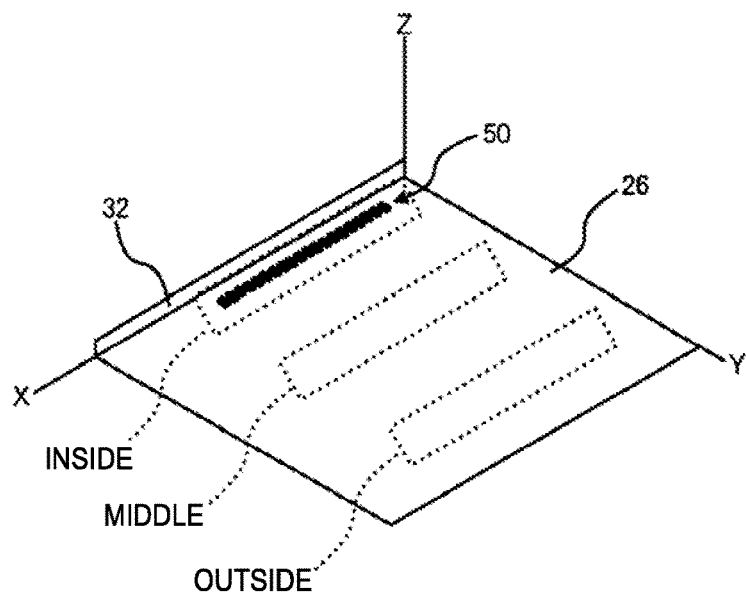
FIG. 51 is a schematic diagram illustrating an example of a positional relation between the short-circuit portion and the resistor or the capacitor.
Figure 52:
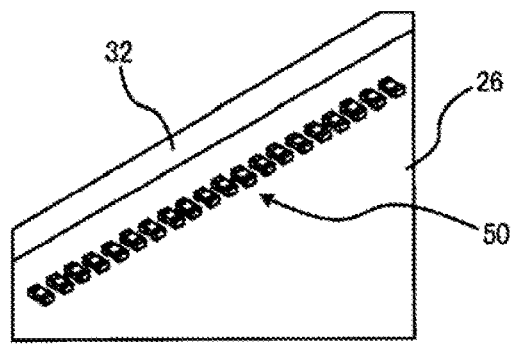
FIG. 52 is a diagram illustrating an example of a resistor string.
Figure 53:
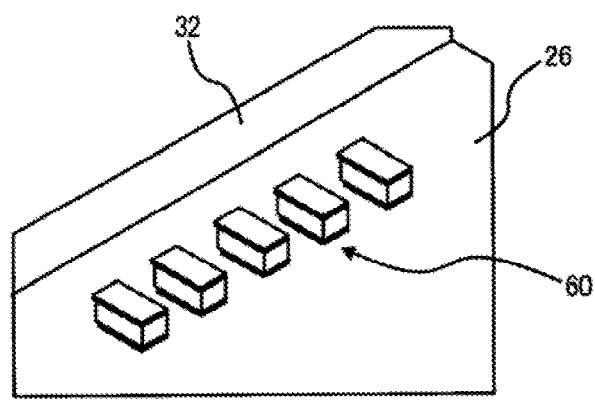
FIG. 53 is a diagram illustrating an example of a capacitor string.

Suppose that the model of resistor 50 in FIG. 49 and the model of the capacitor 60 in FIG. 50 are placed in the inside close to the short-circuit portion 32, the outside close to the open end of the circuit substrate 26, and the middle of the outside and the inside on the circuit substrate 26, as illustrated in FIG. 51. In this case, results of the radiation efficiency were obtained as follows by executing a simulation. In the simulation, twenty resistors 50 were used, as illustrated in FIG. 52, and five capacitors 60 were used, as illustrated in FIG. 5, to facilitate the understanding of the influence. The results of the simulation are illustrated in FIGS. 54 and 55.

Figure 54:
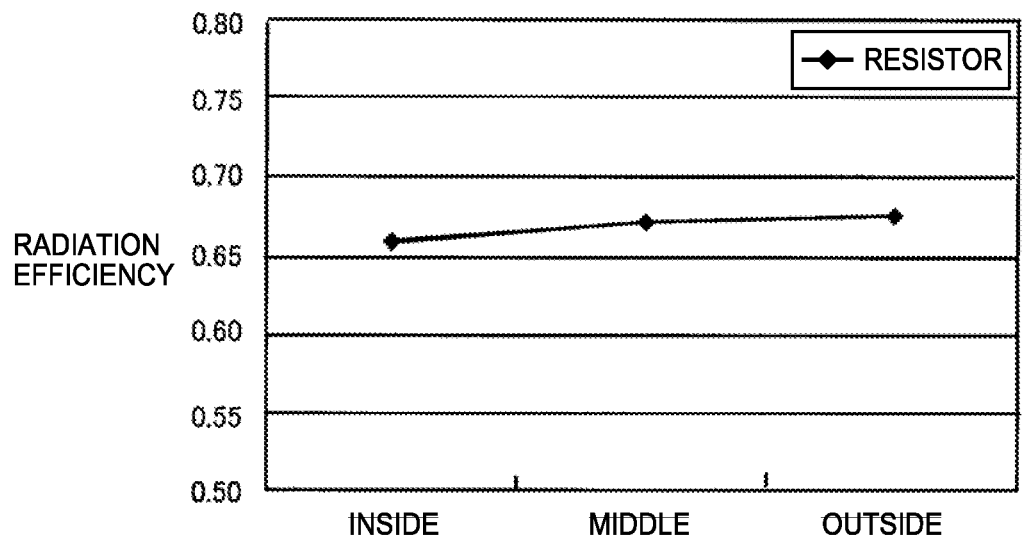
FIG. 54 is a graph illustrating an example of a relation between radiation efficiency and a positional relation of the resistor with respect to the short-circuit portion.
Figure 55:
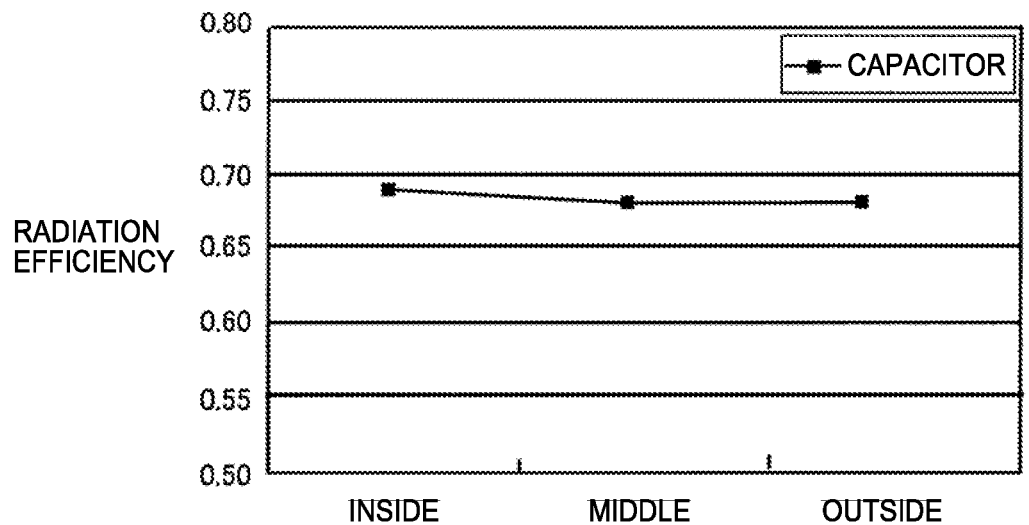
FIG. 55 is a graph illustrating an example of a relation of radiation efficiency and a positional relation of the capacitor with respect to the short-circuit portion.

As illustrated in FIG. 54, it can be understood that the resistor 50 has the same characteristics as the IC circuit 44. As illustrated in FIG. 55, it can be understood that the capacitor 60 has a reverse inclination to the IC circuit 44. The reason why the radiation efficiency deteriorates when the capacitor (metal mass) 60 is away from the surface of the short-circuit portion 32 is that a loss current flowing through a capacitor configured between the front surface of the capacitor 60 and the antenna electrode 34 serving as the radiation plate increases.

Figure 56:
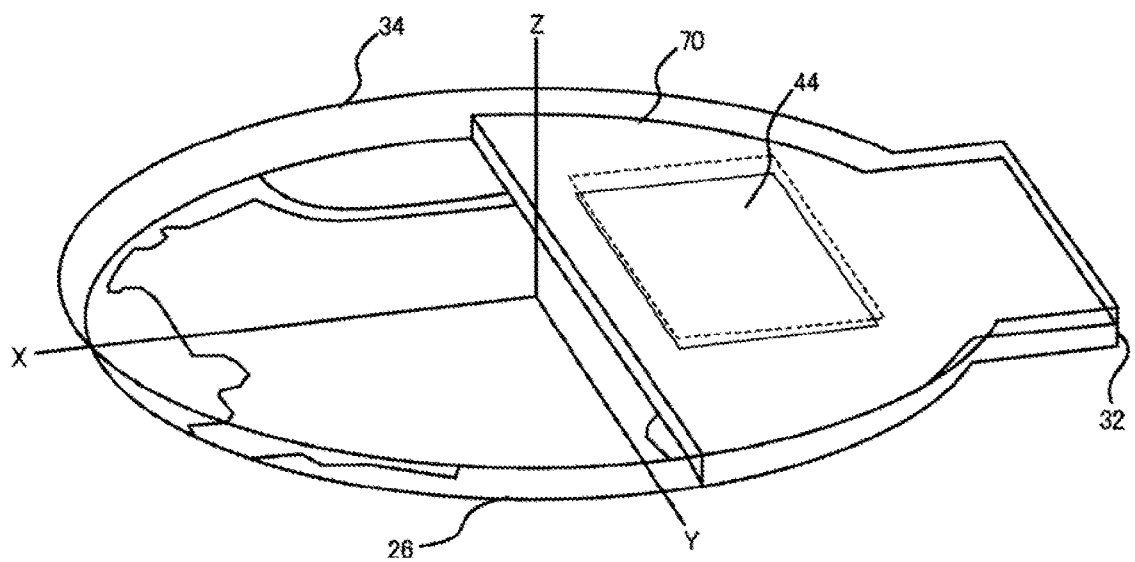
FIG. 56 is a diagram illustrating a structure example when an interval between a shield and a short-circuit portion is almost zero.
Figure 57:
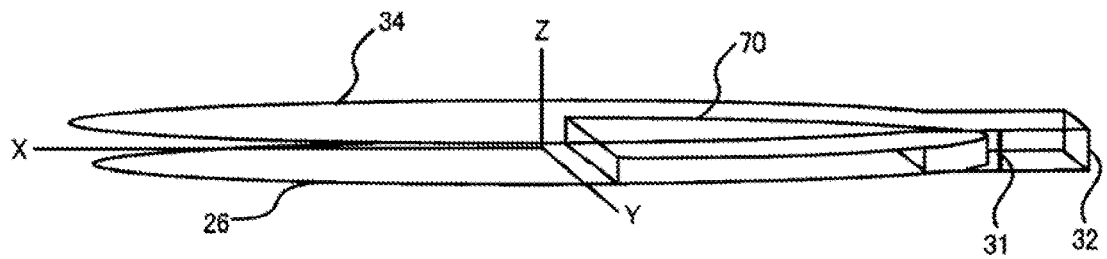
FIG. 57 is a diagram illustrating a structure example when an interval between a shield and a short-circuit portion is a few of mm.
Figure 58:
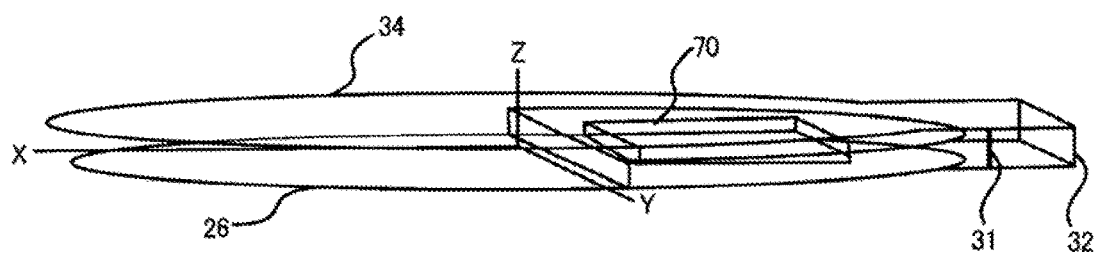
FIG. 58 is a diagram illustrating a structure example when an interval between a shield and a short-circuit portion is a few of mm.

Next, a change in a resonance frequency in a case in which the IC circuit 44 includes a shield and a gap between the shield and the short-circuit portion 32 is changed was obtained by executing a simulation. FIG. 56 illustrates an example of a structure in a case in which the gap between a shield 70 and the short-circuit portion 32 is nearly zero. FIGS. 57 and 58 illustrate an example of a structure in a case in which the gap between the shield 70 and the short-circuit portion 32 is set to a few of mm. It can be understood that the resonance frequency is 2.2 GHz in the case of the structure in FIG. 56 and the resonance frequency is 1.8 GHz in the structure in FIGS. 57 and 58. That is, it can be understood that the resonance frequency of the antenna can be adjusted by adjusting a distance between the short-circuit portion 32 and the shield 70.

Figure 59:
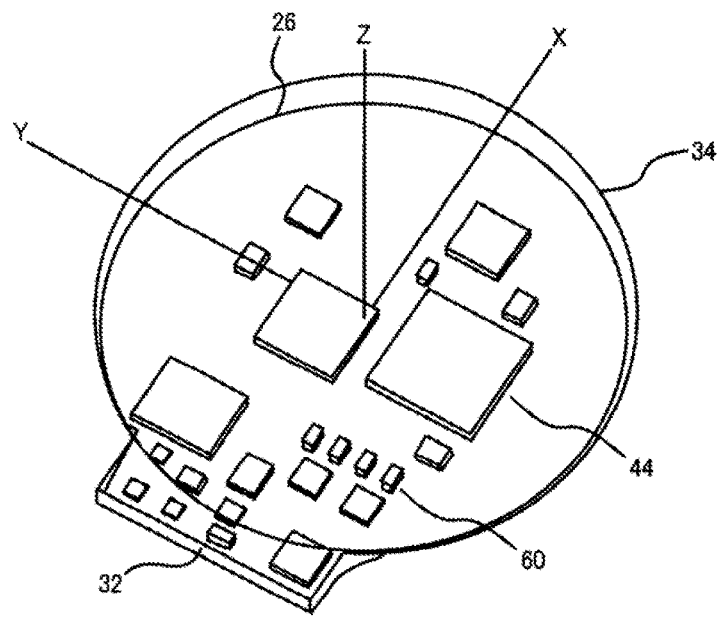
FIG. 59 is a diagram illustrating an example of a positional relation between a short-circuit portion and an IC circuit according to a comparative example.
Figure 60:
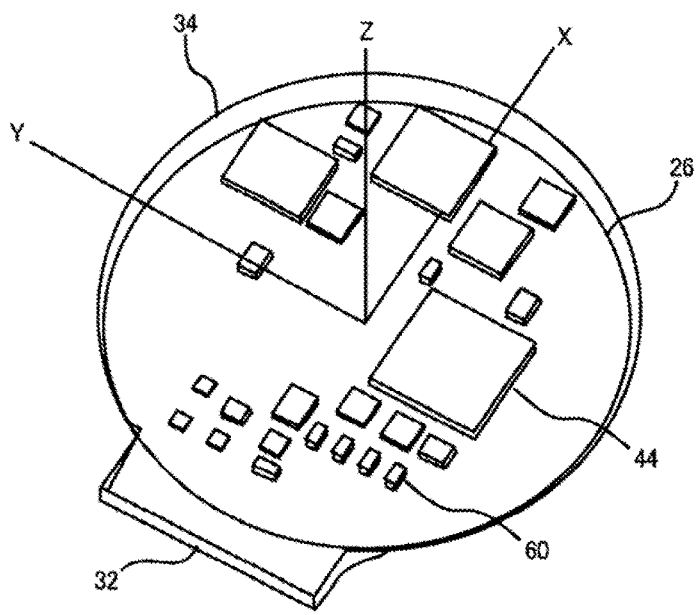
FIG. 60 is a diagram illustrating an example of a positional relation between a short-circuit portion and an IC circuit according to the second embodiment.

A modification example of a substrate layout will be described with reference to FIGS. 59 and 60. FIG. 59 is a diagram illustrating a layout of the related art according to a comparative example. FIG. 60 is a diagram illustrating a layout according to the embodiment.

As apparent in comparison between FIGS. 59 and 60, in the embodiment, the capacitor 60 is disposed at a position close to the short-circuit portion 32 and the IC circuit 44 is disposed to be distant from the short-circuit portion 32. In the layout, an improvement amount of sensitivity was actually measured between the comparative example and the embodiment, and the improvement of sensitivity of 1.8 dB was confirmed.

As described above, according to the embodiment, it is possible to improve the sensitivity by adjusting the positions of the components such as the IC circuit 44. By using the above-described shield 70, the improvement in the radiation efficiency of the antenna of about 3 dB was confirmed through the simulation, compared to a case in which the shield 70 is not included. According to the embodiment, the sensitivity can be improved by 1 dB, and cost of about 10 yens can be reduced compared to the case in which all the components are covered with a shield case. According to the embodiment, it is possible to improve the sensitivity without a loss.

Modification Examples

The invention is not limited to the above-described embodiments, but various modifications can be made as follows, for example. One selected modification aspect or a plurality of selected modification aspects to be described below can be appropriately combined.

Modification Example 1

Figure 61:
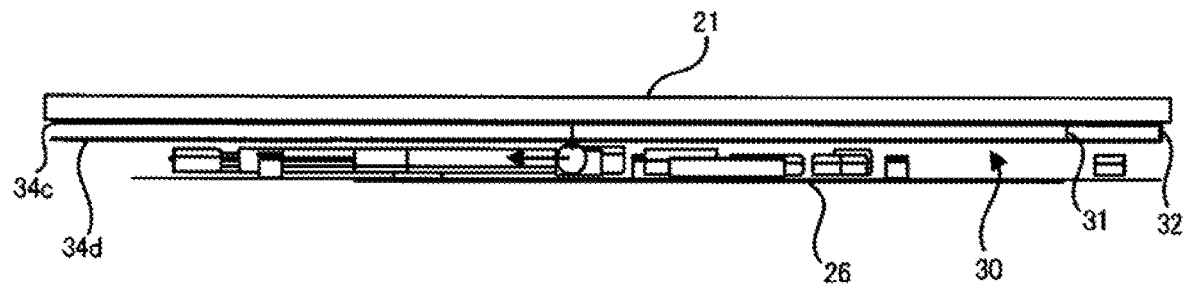
FIG. 61 is a diagram illustrating an example of the configuration of an antenna according to a modification example.

In the above-described embodiments, as illustrated in FIG. 8, the example has been described in which the circuit substrate 26 is used as the conductive plate (the second electrode plate), and the antenna electrode 34 serving as the radiation plate (the first electrode plate) is also used as a liquid crystal shield, but the invention is not limited to this example. For example, as illustrated in FIG. 61, antenna electrodes 34c and 34d may be separately formed in the circuit substrate 26 and a liquid crystal shield.

Modification Example 2

Figure 62:
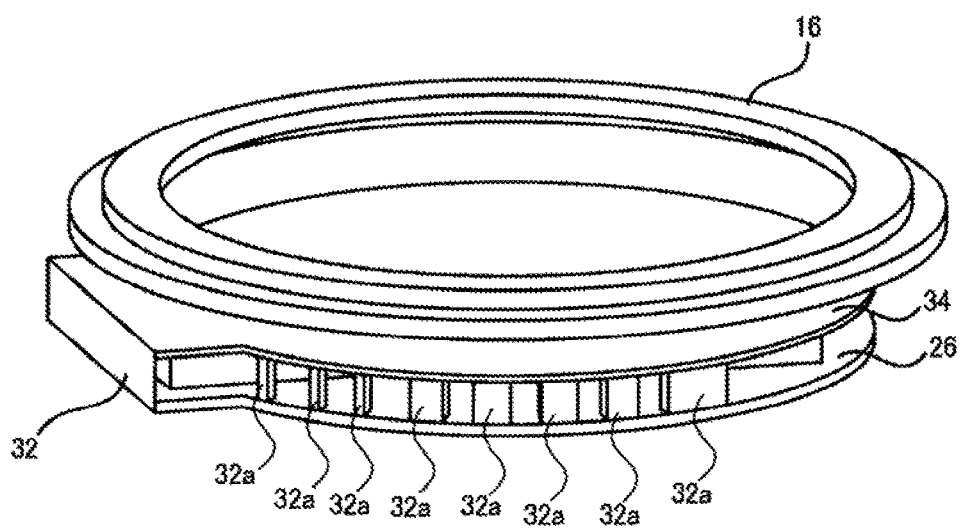
FIG. 62 is a diagram illustrating an example of a second short-circuit portion according to a modification example.

As illustrated in FIG. 62, apart from the short-circuit portion 32, the frequency may also be adjusted by attaching a frequency adjustment bar 32a serving as a second short-circuit portion between the antenna electrode 34 and the circuit substrate 26. In this case, by changing the number of frequency adjustment bars 32a and the attachment position of the frequency adjustment bar 32a, it is possible to adjust the frequency. This is because the same effect as the effect obtained by changing the width of the short-circuit portion 32 can be obtained by installing the frequency adjustment bar 32a. In a case in which the frequency is adjusted, resonance frequencies obtained by changing the number of frequency adjustment bars 32a and the attachment position of the frequency adjustment bar 32a may be calculated by executing a simulation.

Modification Example 3

Figure 63:
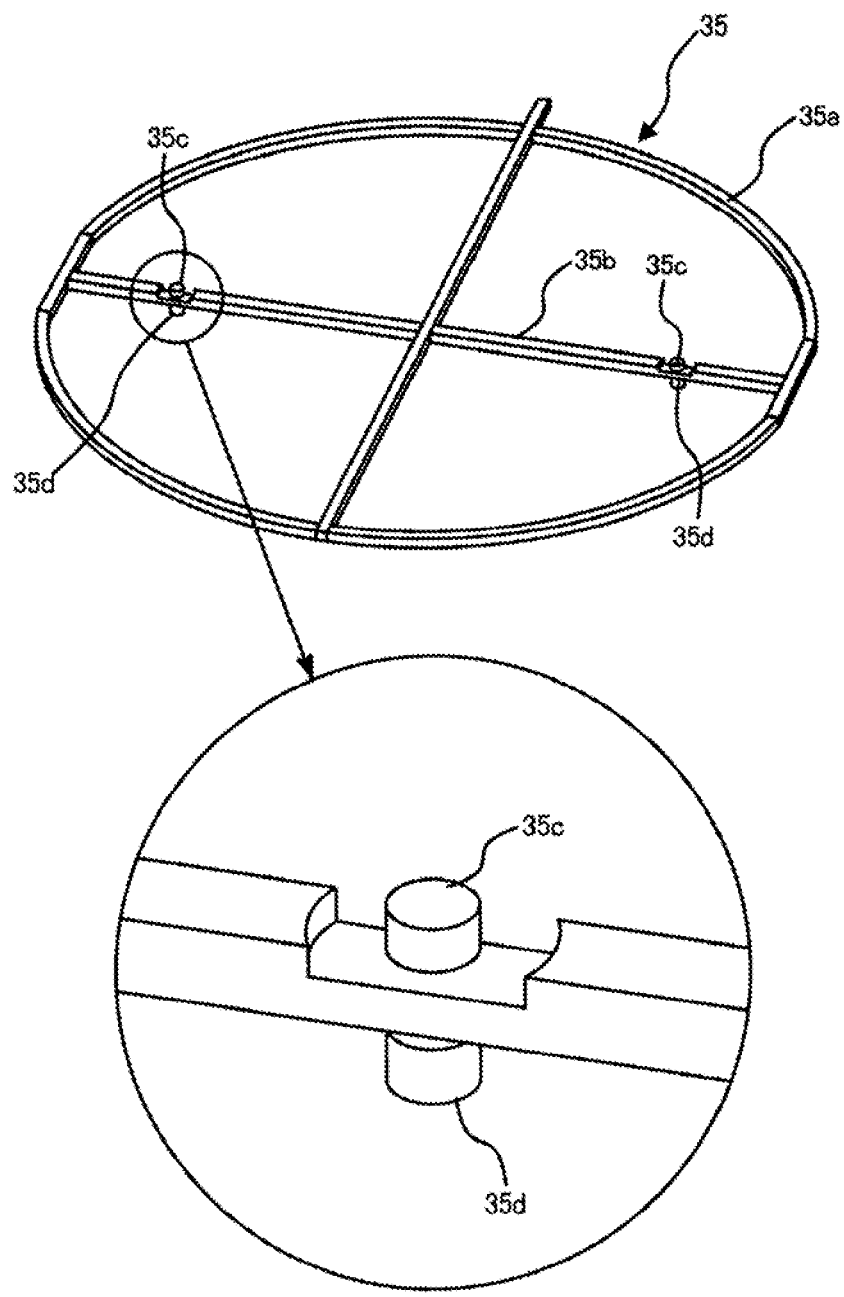
FIG. 63 is a diagram illustrating an example of a spacer according to a modification example.

When the overlapping positions of the antenna electrode 34 which is the radiation plate (the first electrode plate) and the circuit substrate 26 which is the conductive plate (the second electrode plate) are deviated, a deviation in the resonance frequency of the antenna 30 occurs, thereby deteriorating the antenna sensitivity. Alternatively, purpose radio waves are not obtainable. Accordingly, in order to prevent the overlapping positions of the antenna electrode 34 and the circuit substrate 26 from deviating, convex portions 35c and 35d are formed in two spots of the cross portion 35b of the spacer 35, as illustrated in FIG. 63. Further, in the antenna electrode 34 and the circuit substrate 26, concave portions (which include penetrated holes and are referred to as holes below) can be formed to be matched with the positions of the convex portions 35c and 35d, and the convex portions 35c and 35d can be fitted into the holes. By forming the convex portions 35c and 35d and the holes serving as fitting portions, the overlapping positions of the antenna electrode 34 and the circuit substrate 26 may be prevented from deviating. Since the spacer 35, the antenna electrode 34, and the circuit substrate 26 may be fitted, the spacer 35 may have holes or may has holes and convex portions. When the antenna electrode 34 and the circuit substrate 26 are fixed by an adhesive or the like, the antenna sensitivity can be prevented from deteriorating compared to a case in which the antenna electrode 34 and the circuit substrate 26 are not fixed. However, there is a possibility of the adhered positions being deviated due to a manufacturing error. It is more preferable to fix the antenna electrode 34 and the circuit substrate 26 using fitting portions since the deviation does not occur.

Modification Example 4

In the above-described embodiments and modification examples, the cases have been described in which the antenna according to the invention receive GPS radio waves with 1.5 GHz, but the invention is not limited to this configuration. It is suitable for the antenna according to the invention to receive radio waves with a frequency of, for example, 100 MHz to 30 GHz.

In a case in which the invention is applied to an electronic device with a size of a wrist watch, a frequency close to 1.5 GHz of GPS or 2.4 GHz of a wireless LAN is optimum. In a case in which the invention is applied to an electronic device with a size of a mobile phone, a frequency of 700 MHz or 900 MHz used for a mobile phone is optimum.

As a signal of an available positioning satellite, Global Navigation Satellite System (GLONASS), GALILEO, BeiDou Navigation Satellite System (BeiDou) can be exemplified in addition to GPS. In addition, Wide Area Augmentation System (WAAS) and Quasi Zenith Satellite System (QZSS) can be exemplified.

Radio waves corresponding to standards such as Bluetooth (registered trademark) or Wi-Fi (registered trademark) may be received.

Modification Example 5

In the above-described embodiments and modification examples, the cases have been described in which equivalent electric fields of a first ribbon serving as a first radiation element and a second ribbon serving as a second radiation element have a ¼ wavelength, but the invention is not limited to this configuration. For example, the equivalent electric field may be an integer multiple of the ¼ wavelength.

Modification Example 6

In the above-described embodiments and modification examples, the running watch has been exemplified as an example of the electronic device according to the invention, but the invention is not limited thereto. The invention can applied to various electronic devices that receive radio waves through antennas and display information. For example, the invention can also applied to a wearable electronic device such as a wrist watch type active amount meter on which a GPS function is mounted.

Modification Example 7

In the above-described embodiments and modification examples, the liquid crystal panel has been exemplified as an example of the display unit, but an electronic control type display device can be used similarly. For example, an organic electroluminance (EL) or an electro phoretic display (EPD) may be used.

Modification Example 8

In the above-described embodiments and modification examples, the examples have been described in which the right-hand circular polarization is easily received by disposing the short-circuit portion in the range equal to or greater than 180 degrees and equal to or less than 360 degrees of the case. By disposing conversely, it is possible to provide an electronic device appropriate for reception of left-hand circular polarization. That is, by disposing the short-circuit portion in a range equal to or greater than 0 degrees and equal to or less than 180 degrees of the case, it is possible to obtain strong directivity of difference circular polarization in the direction of zenith in a case in which a user takes a running posture.

Modification Example 9

In the above-described embodiments, the short-circuit portion 32 has been installed at the end of the first electrode plate and the second electrode plate, but the invention is not limited thereto. For example, the short-circuit portion 403 in FIG. 6 is not installed at the end of the radiation plate 402 serving as the first electrode plate and the conductive plate 401 serving as the second electrode plate, but is installed at a position located inside from the end.

In the planar inverted F antenna, it is desirable to provide the short-circuit portion at the end of the first electrode plate and the second electrode plate from the viewpoint of improving the sensitivity of the antenna. However, in an actual antenna, for example, the short-circuit portion may not be installed at the end in some cases due to a relation of component disposition. Even in this case, the sensitivity of the antenna at a certain frequency also depends on the length of a current path. Therefore, when the width of the short-circuit portion (the length in the X axis direction in the example illustrated in FIG. 5) is narrower than the maximum width of the first electrode plate and the maximum width of the second electrode plate, the length of the current path can be lengthened. Accordingly, it is possible to improve the sensitivity of the antenna at a certain frequency compared to an antenna of the related art in which the width of a short-circuit portion matches the maximum width of the first electrode plate and the maximum width of the second electrode plate. In the example illustrated in FIG. 6, the X axis direction which is the width direction of the short-circuit portion 403 matches the width direction of the radiation plate 402 serving as the first electrode plate and the conductive plate 401 serving as the second electrode plate, but the invention is not limited thereto. The width direction of the short-circuit portion 403 may be slightly inclined with respect to the X axis. However, from the viewpoint of the sensitivity of the antenna, it is desirable that the width direction of the short-circuit portion matches the width direction of the first and second electrode plates.

What is claimed is:

1. An arm-mounted electronic device comprising:
   an antenna that includes a first electrode plate, a second electrode plate, and a short-circuit portion short-circuiting the first and second electrode plates;
   a display unit that is disposed to overlap the antenna;
   a case in which the antenna and the display unit are accommodated in order of the antenna and the display unit; and
   a band that is connected to the case,
   wherein a width of the short-circuit portion along a direction intersecting an arrangement direction of a position of the short-circuit portion connected to the first electrode plate and a position of the short-circuit portion connected to the second electrode plate is narrower than a maximum width of the first electrode plate in the intersection direction and a maximum width of the second electrode plate in the intersection direction, and
   wherein at least a part of the short-circuit portion is disposed in a range equal to or greater than 180 degrees and equal to or less than 360 degrees on the assumption that in a plan view of the antenna from the display unit, an arrangement direction of the band and the case is defined as a vertical direction, an upper side of a letter in the vertical direction is defined as 0 degrees in a case in which the letter is displayed on the display unit, a clockwise rotation direction is defined as being positive when a direction vertical to the display unit is set as a rotation axis, and one circle of the rotation axis from 0 degrees in the clockwise rotation direction is defined as 360 degrees;
   further comprising:
   a gap holding member that holds a gap between the first and second electrode plates, wherein the gap is filled with air;
   wherein the gap holding member includes a concave portion or a convex portion fitted to the first electrode plate and a concave portion or a convex portion fitted to the second electrode plate.

2. The electronic device according to claim 1, further comprising:
   a second short-circuit portion short-circuiting the first and second electrode plates at a different position from the short-circuit portion.

3. The electronic device according to claim 1, further comprising:
   a circular conductor that is disposed at an overlapping position with the antenna in a plan view of the case in a direction vertical to the display unit,
   wherein at least one incision of the conductor is disposed at a position equal to or greater than 0 degrees and equal to or less than 180 degrees on the assumption that one circle of the rotation axis is 360 degrees.

4. The electronic device according to claim 1,
wherein the second electrode plate is a circuit substrate.

5. The electronic device according to claim 4,
wherein the display unit is an electronic control type display device, and
wherein the electronic device further comprises a wiring that is disposed between the short-circuit portion and the case and connects the display unit to the second electrode plate.

6. The electronic device according to claim 5,
wherein in the plan view, a shape of the first electrode plate and a shape of the display unit are substantially congruent, and
wherein the first electrode plate is disposed at a position closer to the display unit than the second electrode plate.

7. The electronic device according to claim 1, further comprising:
a circuit substrate that is disposed between the first and second electrode plates.

8. An arm-mounted electronic device comprising:
an antenna that includes a first electrode plate, a second electrode plate, and a short-circuit portion short-circuiting the first and second electrode plates;
a display unit that is disposed to overlap the antenna;
a case in which the antenna and the display unit are accommodated in order of the antenna and the display unit; and
a band that is connected to the case,
wherein a width of the short-circuit portion along a direction intersecting an arrangement direction of a position of the short-circuit portion connected to the first electrode plate and a position of the short-circuit portion connected to the second electrode plate is narrower than a maximum width of the first electrode plate in the intersection direction and a maximum width of the second electrode plate in the intersection direction, and
wherein at least a part of the short-circuit portion is disposed in a range equal to or greater than 180 degrees and equal to or less than 360 degrees on the assumption that in a plan view of the antenna from the display unit in a state in which the case is mounted on an arm or a wrist of a user using the band, a little finger side of the user from a center of the case is defined as 0 degrees in a straight line parallel to an arrangement direction of the band and the case and passing through the center of the case, a clockwise rotation direction is defined as being positive when a direction vertical to the display unit and passing through the center of the case is set as a rotation axis, and one circle of the rotation axis from 0 degrees in the clockwise rotation direction is defined as 360 degrees;
further comprising:
a gap holding member that holds a gap between the first and second electrode plates, wherein the gap is filled with air;
wherein the gap holding member includes a concave portion or a convex portion fitted to the first electrode plate and a concave portion or a convex portion fitted to the second electrode plate.

9. The electronic device according to claim 8, further comprising:
a second short-circuit portion short-circuiting the first and second electrode plates at a different position from the short-circuit portion.

10. The electronic device according to claim 8, further comprising:
a circular conductor that is disposed at an overlapping position with the antenna in a plan view of the case in a direction vertical to the display unit,
wherein at least one incision of the conductor is disposed at a position equal to or greater than 0 degrees and equal to or less than 180 degrees on the assumption that one circle of the rotation axis is 360 degrees.

11. The electronic device according to claim 8,
wherein the second electrode plate is a circuit substrate.

12. The electronic device according to claim 11,
wherein the display unit is an electronic control type display device, and
wherein the electronic device further comprises a wiring that is disposed between the short-circuit portion and the case and connects the display unit to the second electrode plate.

13. The electronic device according to claim 12,
wherein in the plan view, a shape of the first electrode plate and a shape of the display unit are substantially congruent, and
wherein the first electrode plate is disposed at a position closer to the display unit than the second electrode plate.

14. The electronic device according to claim 8, further comprising:
a circuit substrate that is disposed between the first and second electrode plates.

* * * * *